United States Patent
Weber et al.

(10) Patent No.: US 8,866,222 B2
(45) Date of Patent: Oct. 21, 2014

(54) CHARGE COMPENSATION SEMICONDUCTOR DEVICE

(71) Applicant: Infineon Technologies Austria AG, Villach (AT)

(72) Inventors: Hans Weber, Bayerisch Gmain (DE); Stefan Gamerith, Villach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/780,753

(22) Filed: Feb. 28, 2013

(65) Prior Publication Data

US 2013/0234761 A1    Sep. 12, 2013

Related U.S. Application Data

(63) Continuation-in-part of application No. 13/414,037, filed on Mar. 7, 2012.

(51) Int. Cl.
H01L 29/78 (2006.01)

(52) U.S. Cl.
USPC ........... 257/340; 257/341; 257/336; 257/337; 257/322; 257/490; 257/495; 257/E29.27; 257/E29.066; 257/E29.256; 257/E21.416; 257/E21.418

(58) Field of Classification Search
CPC ...................... H01L 29/41766; H01L 21/2815; H01L 21/823828; H01L 21/823892
USPC ......... 257/340, 341, 335, 337, 322, 490, 495, 257/E29.27, E29.066, E29.256, E29.416, 257/E29.418
See application file for complete search history.

(56) References Cited

U.S. PATENT DOCUMENTS

| | | | |
|---|---|---|---|
| 6,664,590 B2 * | 12/2003 | Deboy ........................ | 257/328 |
| 6,734,520 B2 | 5/2004 | Kapels et al. | |
| 6,831,338 B1 | 12/2004 | Roy | |
| 7,339,236 B2 * | 3/2008 | Nitta et al. ................... | 257/347 |
| 7,750,397 B2 | 7/2010 | Hirler et al. | |
| 2002/0096708 A1 | 7/2002 | Ahlers et al. | |
| 2005/0045922 A1 * | 3/2005 | Ahlers et al. ................ | 257/242 |

(Continued)

FOREIGN PATENT DOCUMENTS

| | | |
|---|---|---|
| DE | 102005047056 B3 | 1/2007 |
| DE | 102005041322 A1 | 3/2007 |
| DE | 102007018631 B4 | 1/2009 |

*Primary Examiner* — Zandra Smith
*Assistant Examiner* — Damian A Hillman
(74) *Attorney, Agent, or Firm* — Murphy, Bilak & Homiller, PLLC

(57) ABSTRACT

A semiconductor device includes a semiconductor body and a source metallization arranged on a first surface of the body. The body includes: a first semiconductor layer including a compensation-structure; a second semiconductor layer adjoining the first layer, comprised of semiconductor material of a first conductivity type and having a doping charge per horizontal area lower than a breakdown charge per area of the semiconductor material; a third semiconductor layer of the first conductivity type adjoining the second layer and comprising at least one of a self-charging charge trap, a floating field plate and a semiconductor region of a second conductivity type forming a pn-junction with the third layer; and a fourth semiconductor layer of the first conductivity type adjoining the third layer and having a maximum doping concentration higher than that of the third layer. The first semiconductor layer is arranged between the first surface and the second semiconductor layer.

9 Claims, 16 Drawing Sheets

(56) References Cited

U.S. PATENT DOCUMENTS

| | | |
|---|---|---|
| 2005/0082591 A1 | 4/2005 | Hirler et al. |
| 2007/0085136 A1 | 4/2007 | Krumrey et al. |
| 2007/0126056 A1 | 6/2007 | Hirler |
| 2007/0138544 A1 | 6/2007 | Hirler et al. |
| 2008/0265329 A1 | 10/2008 | Hirler et al. |
| 2010/0276729 A1 | 11/2010 | Aoi et al. |

* cited by examiner

CHARGE COMPENSATION SEMICONDUCTOR DEVICE

PRIORITY CLAIM

This application is a Continuation-In-Part (CIP) of U.S. patent application Ser. No. 13/414,037, filed on 7 Mar. 2012, the content of said application incorporated herein by reference in its entirety.

TECHNICAL FIELD

Embodiments of the present invention relate to semiconductor devices having charge compensation structures, in particular to power semiconductor transistors having charge compensation structures, and to related methods for producing such semiconductor devices.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance Ron and high breakdown voltages $U_{bd}$ are often desired.

For this purpose charge compensation semiconductor devices were developed. The compensation principle is based on a mutual compensation of charges in n- and p-doped zones in the drift region of a vertical MOSFET.

Typically, the charge compensation structure formed by p-type and n-type zones is arranged below the actual MOSFET-structure with source, body regions and gate regions, and also below the associated MOS-channels which are arranged next to one another in the semiconductor volume of the semiconductor device or interleaved in one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components which results in a significant reduction of the on-state resistance Ron despite the loss of a current-carrying area. The reduction of the on-state resistance Ron of such semiconductor power devices is associated with a reduction of the heat loss, so that such semiconductor power devices with charge compensation structure remain "cool" compared with conventional semiconductor power devices.

Meanwhile, switching losses of semiconductor devices become more important. Depending on device operation, output charge $Q_{OSS}$ and electric energy $E_{OSS}$, respectively, stored in the space charge region formed in the off-state and during reverse bias, respectively, mainly determine the switching losses. The stored charge $Q_{OSS}$ of semiconductor devices with charge compensation structures may be comparatively high. This may result in significant switching losses $E_{OSS}$. In addition to enable reverse blocking, the output charge $Q_{OSS}$ (at specific blocking voltage) has to be completely removed which results in switching delays.

Accordingly, there is a need to reduce switching losses and switching delays of semiconductor devices with charge compensation structures.

SUMMARY

According to an embodiment of a semiconductor device, the semiconductor device includes a semiconductor body having a first surface defining a vertical direction and a source metallization arranged on the first surface. In a vertical cross-section the semiconductor body further includes: a drift region of a first conductivity type; at least two compensation regions of a second conductivity type each of which forms a pn-junction with the drift region and is in low resistive electric connection with the source metallization; a drain region of the first conductivity type having a maximum doping concentration higher than a maximum doping concentration of the drift region, and a third semiconductor layer of the first conductivity type arranged between the drift region and the drain region and includes at least one of a floating field plate and a floating semiconductor region of the second conductivity type forming a pn-junction with the third semiconductor layer.

According to an embodiment of a semiconductor device, the semiconductor device includes a semiconductor body including: a first surface defining a vertical direction; a first semiconductor layer extending to the first surface and comprising a pn-compensation-structure; a second semiconductor layer adjoining the first semiconductor layer and being made of a semiconductor material of a first conductivity type, and having a doping charge per horizontal area lower than a breakdown charge per area of the semiconductor material; and a third semiconductor layer of the first conductivity type adjoining the second semiconductor layer and including at least one of a self-charging charge trap, a floating field plate and a semiconductor region of a second conductivity type forming a pn-junction with the third semiconductor layer.

According to an embodiment of a semiconductor device, the semiconductor device includes a semiconductor body having a first surface defining a vertical direction and a first metallization arranged on the first surface. The semiconductor body further includes in a vertical cross-section: a first semiconductor layer extending to the first surface and including a pn-compensation-structure connected to the first metallization; and a third semiconductor layer of the first conductivity type arranged below the first semiconductor layer and including at least one of a floating field plate and a semiconductor region of a second conductivity type forming a closed pn-junction within the third semiconductor layer.

According to an embodiment of a method for producing a semiconductor device, the method includes: providing a semiconductor body of a first conductivity type comprising a top surface defining a vertical direction and a backside surface arranged opposite the top surface; forming in the semiconductor body from the top surface at least one of a trench field plate which is partly separated from the semiconductor body by a dielectric region, and a semiconductor region of a second conductivity type forming a pn-junction within the semiconductor body; epitaxial depositing at least two semiconductor layers of the first conductivity type on the top surface; forming in the uppermost semiconductor layer of the at least two semiconductor layers a pn-compensation structure so that in a vertical cross-section at least two compensation regions of the second conductivity type are formed each of which forms a pn-junction with a remaining portion of the uppermost semiconductor layer; and forming a first metallization above the at least two semiconductor layers in low resistive contact with the at least two compensation regions.

According to an embodiment of a semiconductor device, the semiconductor device includes a semiconductor body having a first surface defining a vertical direction, and a source metallization arranged on the first surface. In a vertical cross-section the semiconductor body includes a drift region of a first conductivity type, a drain region of the first conductivity type having a maximum doping concentration higher than a maximum doping concentration of the drift region, and a third semiconductor layer of the first conductivity type arranged between the drift region and the drain region and including at least one of a floating field plate and a floating semiconductor region of the second conductivity type forming a pn-junction with the third semiconductor layer. In the vertical cross-section, at least two field plates which are in ohmic contact with the source metallization are disposed in the drift region and separated from the drift region by a respective field dielectric layer.

According to an embodiment of a semiconductor device, the semiconductor device includes a semiconductor body having a first surface defining a vertical direction and a source metallization arranged on the first surface. The semiconductor body further includes: a first semiconductor layer including a compensation-structure; a second semiconductor layer adjoining the first semiconductor layer, being comprised of a semiconductor material of a first conductivity type, and having a doping charge per horizontal area lower than a breakdown charge per area of the semiconductor material; a third semiconductor layer of the first conductivity type adjoining the second semiconductor layer and comprising at least one of a self-charging charge trap, a floating field plate and a semiconductor region of a second conductivity type forming a pn-junction with the third semiconductor layer; and a fourth semiconductor layer of the first conductivity type adjoining the third semiconductor layer and having a maximum doping concentration which is higher than a maximum doping concentration of the third semiconductor layer. The first semiconductor layer is arranged between the first surface and the second semiconductor layer.

According to an embodiment of a circuit for driving a load, the circuit includes: a designed circuit voltage; and at least one semiconductor switch having a rated break-down voltage which is higher than the designed circuit voltage. The at least one semiconductor switch includes a semiconductor body which has a first surface and includes a first semiconductor layer of a first conductivity type, a second semiconductor layer of the first conductivity type adjoining the first semiconductor layer, a third semiconductor layer of the first conductivity type adjoining the second semiconductor layer, and a body region of a second conductivity type forming a pn-junction with the first semiconductor layer. The at least one semiconductor switch further includes: a source metallization arranged on the first surface and in ohmic contact with the body region; and a drain metallization in ohmic contact with the third semiconductor layer. The first semiconductor layer includes a compensation-structure in ohmic contact with the source metallization, and the third semiconductor layer includes a floating compensation-structure.

According to an embodiment of a method for producing a semiconductor device, the method includes: providing a semiconductor body of a first conductivity type comprising a top surface defining a vertical direction, and a backside surface arranged opposite the top surface; forming in the semiconductor body from the top surface at least one of a floating trench field plate which is partly separated from the semiconductor body by a dielectric region, and a floating semiconductor region of a second conductivity type which forms a pn-junction within the semiconductor body; epitaxial depositing at least two semiconductor layers of the first conductivity type on the top surface; forming in an upper semiconductor layer of the at least two semiconductor layers a compensation-structure; and forming a first metallization above the at least two semiconductor layers in ohmic contact with the compensation-structure.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
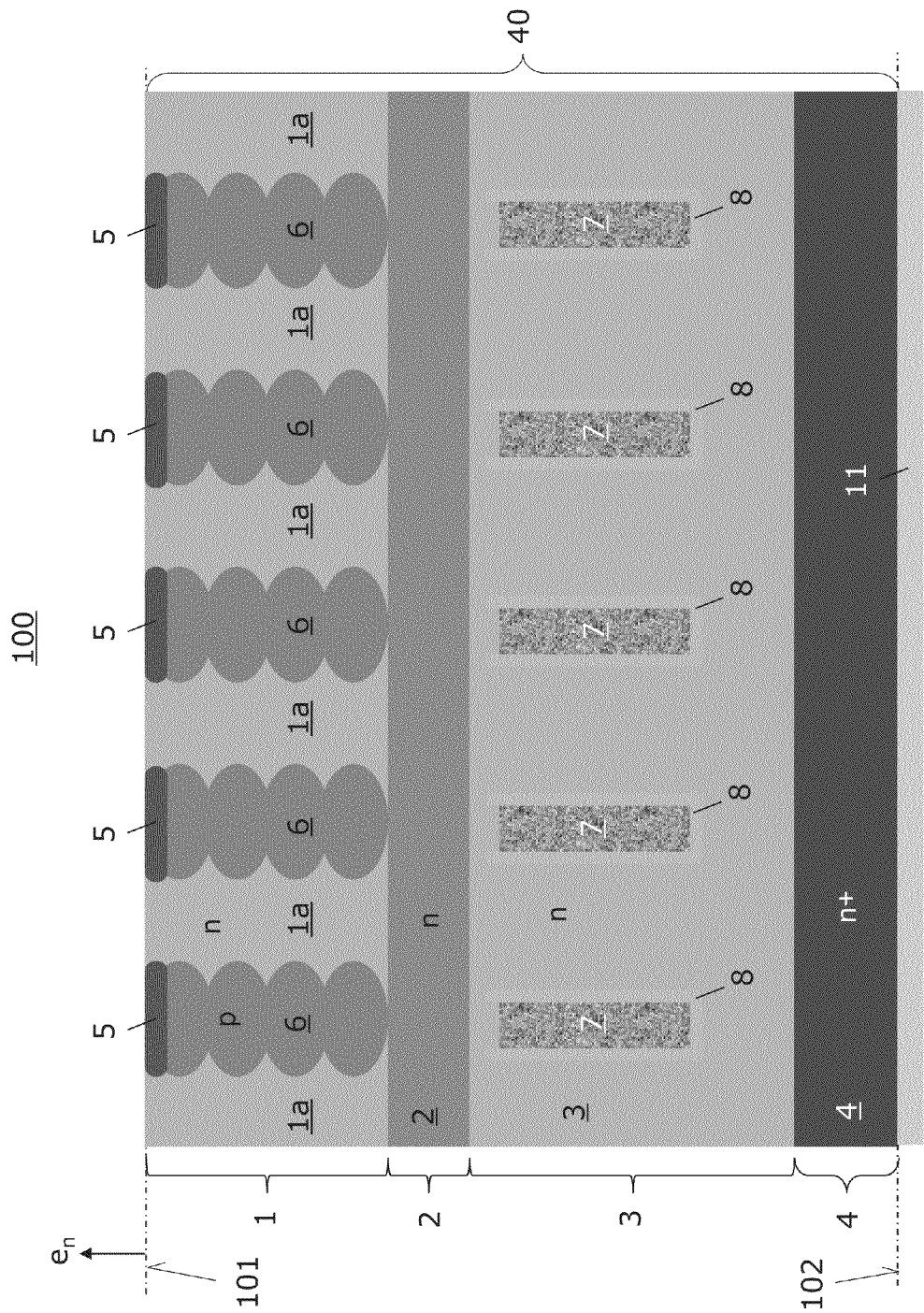
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices, in particular to field effect semiconductor transistor and manufacturing methods therefor. Within this specification the terms "semiconductor device" and "semiconductor component" are used synonymously. The formed semiconductor device is typically a vertical semiconductor device such as a vertical MOSFET with a source metallization and an insulated gate electrode arranged on the first surface and a drain metallization arranged on a second surface arranged opposite to the first surface. Typically, the formed semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode. In the context of the present specification, the term "in low resistive electric contact" intends to describe that there is a low-ohmic ohmic current path between respective elements or portions of a semiconductor device when no voltages are applied to and/or across the semiconductor device. Within this specification the terms "in low resistive electric contact", "electrically coupled", "in low ohmic contact", and "in low resistive electric connection" are used synonymously. Likewise, the terms "in resistive electric contact", "in ohmic contact", and "in resistive electric connection" are used synonymously within this specification.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "floating field plate" intends to describe a conductive region forming an electrode which is arranged in a semiconductor region, typically the drift region, in a vertical cross-section insulated from the semiconductor region at three sides, and configured to trap charges, typically negative charges for an n-type semiconductor region, during the blocking-mode of the semiconductor device so that a portion of the semiconductor region is depleted by the trapped charges. The conductive region is typically made of a material with metallic or near-metallic electric conductivity such as a metal, for example wolfram, highly doped poly-silicon, a silicide or the like. Furthermore, the floating field plate may be formed by a weakly doped monocrystalline semiconductor region in which an electron channel may be formed.

In the context of the present specification, the term "self-charging charge trap" intends to describe a floating field plate which is configured to generate and trap electric charges during the blocking-mode of the semiconductor device and/or during commutating the semiconductor device. The term "self-charging charge trap" shall embrace a floating field plate which includes charge generation centers for generating electron-hole pairs during commutating the semiconductor device and/or during the blocking-mode of the semiconductor device. Further, the term "self-charging charge trap" shall embrace a floating field-plate having at least in an opening region in contact with the surrounding semiconductor material a moderately or highly n-doped field stop portion in the field plate and/or in the surrounding semiconductor material. During commutating the semiconductor device and/or during the blocking-mode of the semiconductor device, electrons may be released in the field stop portion and trapped in the self-charging charge trap. The doping concentration of the field stop portion is chosen such that the electric field formed during commutating and/or during the blocking-mode is stopped in or next to the field stop portion.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from the forward direction or conducting direction in which a pn-load junction, for example the pn-junction between the body region and the drift region of a MOSFET, is forwardly biased to the opposite direction or reverse direction in which the pn-load junction is reversely biased. The term "hard commutating" as used in this specification intends to describe commutating with a speed of at least about $10^{10}$ V/s, more typically with a speed of at least about $2*10^{10}$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

With reference to FIG. 1, a first embodiment of a semiconductor device 100 is explained. FIG. 1 illustrates a vertical cross-section through a semiconductor body 40 of the semiconductor device 100. The semiconductor body 40 extends between a first surface 101 defining a vertical direction $e_n$ and a second surface 102 arranged opposite to the first surface 101. A first metallization (not shown in FIG. 1), typically forming a source metallization, is arranged on the first surface 101. A second metallization 11, typically forming a drain metallization, is arranged on the second surface 102. Furthermore, a third metallization (also not shown in FIG. 1), typically forming a gate metallization, is typically also arranged on the first surface 101 and insulated from the first metallization and semiconductor body 40. Accordingly, the semiconductor device 100 may be operated as a three-terminal device.

The semiconductor body 40 typically includes a bulk mono-crystalline material 4 and at least one epitaxial layer 3, 2, 1 formed thereon. Using the epitaxial layer(s) 3, 2, 1 provides more freedom in tailoring the background doping of the material since the doping concentration can be adjusted during deposition of the epitaxial layer or layers.

In the exemplary embodiment illustrated in FIG. 1, the semiconductor body 40 includes an n-type first semiconductor layer 1 extending to the first surface 101, an n-type second semiconductor layer 2 arranged below and adjoining the first semiconductor layer 1, an n-type third semiconductor layer 3 arranged below and adjoining the second semiconductor layer 2, and an $n^+$-type semiconductor layer 4 which is arranged below and adjoins the third semiconductor layer 3, extends to the second surface 102 and typically forms a drain contact layer.

According to an embodiment, the first semiconductor layer 1 includes a plurality of p-type body regions 5 and a pn-compensation-structure having p-type compensation regions 6 each of which adjoins a respective body region 5. The p-type compensation regions 6 are, in the vertical cross-section, arranged vertically between remaining n-type portions 1a of the first semiconductor layer 1 forming a drift region 1a.

In the exemplary embodiment, the p-type compensation regions 6 are formed as vertically orientated pillars. Alternatively, the p-type compensation regions 6 are formed as substantially vertically orientated strip-type parallelepipeds.

Figure 2:
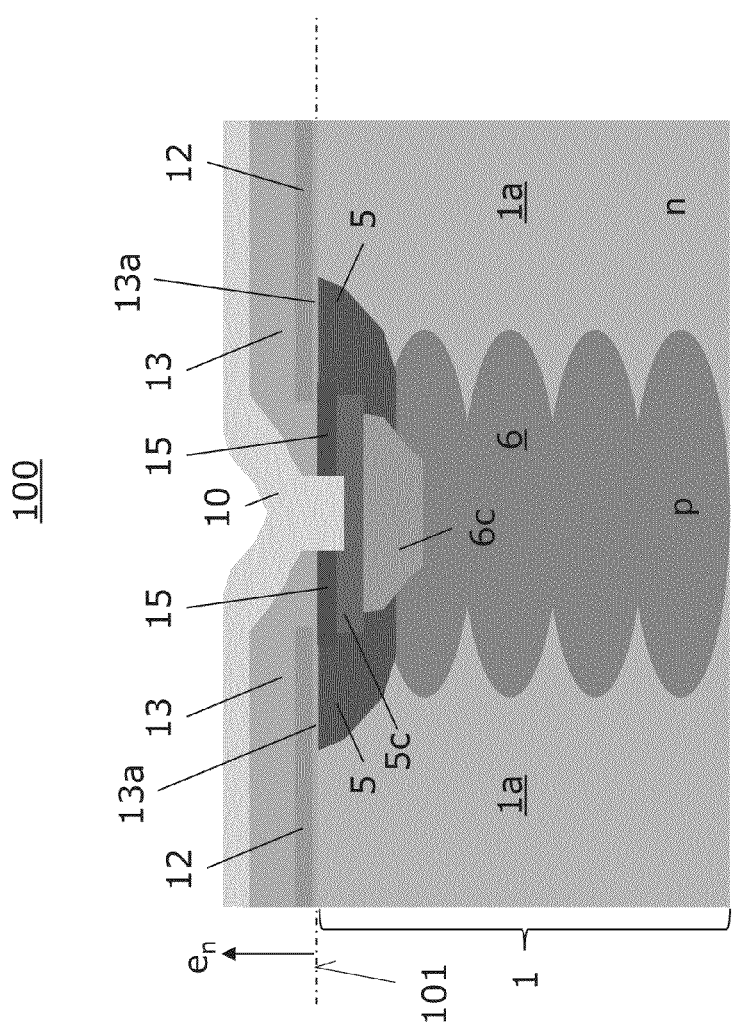
FIG. 2 illustrates a section of the vertical cross-section through the semiconductor device illustrated in FIG. 1 according to an embodiment.

The compensation regions 6 are in low resistive electric connection with the source metallization. This is explained with regard to FIG. 2 illustrating an enlarged section of the first semiconductor layer 1 illustrated in FIG. 1 and the structures typically formed on the first surface 101. The illustrated section of FIG. 2 typically corresponds to one of a plurality of unit cells of the first semiconductor layer 1 and an upper part of the semiconductor device 100, respectively.

In the exemplary embodiment, a p$^+$-type body contact region 5c and an n$^+$-type source region 15 are formed in a body region 5. Further, a p$^+$-type contact region 6c extends between the body contact region 5c and compensation region 6. The body contact region 5c, source region 15 and contact region 6c are not shown in FIG. 1 and the following Figures for sake of clarity.

A dielectric region 13 is arranged on the first surface 101. A portion 13a of the dielectric region 13 is arranged between the first surface 101 and the gate electrode 12 which extends in a horizontal direction from the drift region is along the body region 5 at least to the source region 15 so that an inversion channel, which is also referred to herein as MOS-channel, may be formed by the field-effect in the body region 5 along portion 13a forming a gate dielectric region. Accordingly, the semiconductor device 100 may be operated as a MOSFET.

The remaining portion of the dielectric region 13 forms an interlayer dielectric between the source metallization 10 and gate electrode 12 and first surface 101, respectively.

In the exemplary embodiment, the source metallization 10 electrically contacts the source region 15 and the body contact region 5c via a shallow trench contact formed through the interlayer dielectric 13 and into the semiconductor body. In other embodiments, the source metallization 10 electrically contacts the source region 15 and the body contact region 5c at the first surface 101.

According to an embodiment, the doping concentrations of the p-type compensation regions 6 and the drift regions 1a are chosen such that, in the off-state, their charges can be mutually depleted and that, in the on-state, an uninterrupted, low-resistive conduction path is formed from the source metallization 10 to the drain metallization 1.

According to another embodiment, the gate electrode 12 and gate dielectric 13a may be formed in a trench extending from the first surface 101 into the semiconductor body. In this embodiment, the body region 5 and source region 15 adjoin an upper part of the trench while the drift zone 1a adjoins a lower part of the trench. In this embodiment, the drift zone 1a may not extend to the first surface 101 in the active area. Referring again to FIG. 1, further embodiments are explained.

MOSFETs are in typical applications mainly exposed to reverse voltages which are significantly below the rated blocking voltage. Typically, MOSFETs are used in circuits with a designed circuit voltage during nominal operation which results in a nominal reverse voltages $U_c$ of only about 30% to about 70% of the rated blocking voltage, for example to about 400 V for a rated blocking voltage of 650 V. Furthermore, conventional compensation MOSFETs are typically designed such that the pn-compensation structure is already substantially depleted in the horizontal direction at comparatively low reverse voltages corresponding to about only 10% of nominal reverse voltages $U_c$ or even less to reduce stored electric energy $E_{OSS}$. Even further, the stored charge $Q_{OSS}$ is mainly determined by the charge $Q_h$ corresponding to the horizontally depletion of conventional compensation structures. Accordingly, there is typically a trade-off between on-resistance $R_{on}$ and stored charge $Q_{OSS}$ in conventional compensation MOSFETs. This may be expressed as $R_{on}*Q_{OSS}=R_{on}*Q_h=$const. Thus, there is typically a trade-off between forward current losses and switching losses in conventional compensation MOSFETs.

Even when taking into account typical voltage spikes, a MOSFET is typically exposed to reverse voltages which are significantly below rated breakdown voltage $U_{bd}$ during normal operation. Higher values may result from unanticipated switching events which occur only rarely. The depletable semiconductor volume of conventional compensation MOSFETs corresponds however to at least 100% of rated blocking voltage. Accordingly, conventional compensation MOSFETs are typically "oversized" with respect to stored charge $Q_{OSS}$.

According to an embodiment, the compensation structure 1a, 6 and the second semiconductor layer 2 of the semiconductor device 100 are dimensioned such that a nominal reverse off-voltage $U_{off}$ which is lower than the rated breakdown voltage $U_{bd}$ and corresponds to the nominal reverse voltages $U_c$ plus a safety margin of about 10% to about 25%, for example of a few 10 V for a power semiconductor device, taking into account expected voltage spikes, substantially drops across the compensation structure 1a, 6 and the second semiconductor layer 2 during the blocking-mode in which the pn-junctions between the drift region 1a and the body regions 5 are reverse biased. Accordingly, stored charge $Q_{OSS}$ and switching losses may at given on-resistance $R_{on}$ and rated breakdown voltage $U_{bd}$ be reduced compared to conventional compensation MOSFETs.

As a rule of thumb, the vertical extension of the first semiconductor layer 1 when made of silicon is equal or somewhat larger than about 50 nm*$U_{off}$ but smaller than about 50 nm*$U_{bd}$. Accordingly, the compensation structures 1a, 6 may only block reverse voltages up to about the nominal reverse off-voltage $U_{off}$.

The second semiconductor layer 2 may have the same doping concentration as the drift region 1a.

The volume of the second semiconductor layer 2 which is arranged below the compensation structures 1a, 6 may be operated as field stop at reverse voltages of about the nominal reverse off-voltage $U_{off}$. Accordingly, the second semiconductor layer 2 has typically a doping charge per horizontal area Q which is about $Q_c*U_{off}/U_{bd}$, for example about two thirds of the breakdown charge per area $Q_c$ of the used semiconductor material. For example, the breakdown charge per area $Q_c$ is, depending on doping concentration, about $2*10^{12}$ elementary charges per cm$^2$ to about $3*10^{12}$ elementary charges per cm$^2$ for silicon.

According to an embodiment, the third semiconductor layer 3 includes a further structure which is configured to deplete the third semiconductor layer 3 when the second semiconductor layer 2 is punched through during the blocking-mode, i.e. when a space charge region formed between the compensation regions 6 extends through the second semiconductor layer 2. Thus, an avalanche breakdown of the semiconductor device 100 at voltages between a nominal reverse off-voltage $U_{off}$ and rated break-down voltage is avoided.

In the exemplary embodiment illustrated in FIG. 1, a floating field plate 7 which is partly insulated from and adjoins the third semiconductor layer 3 is arranged in the third semiconductor layer 3 below each compensation region 6. The floating field plates 7 may be arranged substantially centered with respect to a corresponding compensation region 6. In other embodiments, the floating field plates 7 are off-set with respect to the compensation regions 6. Even further, the pitch and the lateral orientation of the compensation region 6 and floating field plates 7 may differ.

During the blocking-mode of the semiconductor device 100 and if the second semiconductor layer 2 is punched through, the floating field plates 7 are charged, i.e. negatively charged for an n-type third semiconductor layer 3. Accordingly, the third semiconductor layer 3 is horizontally depleted between the field plates 7 and thus an avalanche breakdown of the semiconductor device 100 at voltages between the nominal reverse off-voltage $U_{off}$ and rated break-down voltage $U_{bd}$ is avoided. Due to using the floating field plates 7, the doping concentration of the third semiconductor layer 3 may be comparatively high, for example substantially match the doping concentration of the drift region 1a. Thus, the on-state resistance $R_{on}$ of the semiconductor device 100 is typically kept low. Furthermore, the floating field plates 7 are only charged at exceptionally high voltages above nominal reverse off-voltage $U_{off}$. Accordingly, switching-losses during normal operation of the semiconductor device 100 are kept low. Since reverse voltages above nominal reverse off-voltage $U_{off}$ are rare, the overall switching-losses of the semiconductor device 100 are typically lower compared to conventional compensation MOSFETs of same on-state resistance $R_{on}$. In other words, the trade-off between switching losses and forward current losses is improved.

In the exemplary embodiment illustrated in FIG. 1, the sidewalls and the bottom wall of each of the floating field plates 7 are, in the illustrated cross-section, separated from the third semiconductor layer 3 by respective insulating regions 8, for example comprised of silicon oxide. Thus, the floating field plates 7 and insulating region 8 form self-charging charge traps 7, 8 for electrons.

According to an embodiment, the floating field plates 7 include charge generation centers for generating electron-hole pairs in an electric field. For example, the floating field plates 7 may be comprised of a conductive material having a Fermi-energy which lies in the conduction band of the semiconductor material of the third semiconductor layer 3. For example, the floating field plates 7 may be comprised of a metal like wolfram or a silicide which have high charge generation rates in electric fields. When a metal is used as a conductive material of the floating field plates 7, a butting contact may be used between each of the floating field plates 7 and the third semiconductor layer 3 to avoid a rectifying contact.

Alternatively, the floating field plates 7 may be comprised of a conductive semiconductor material with lattice defects such as highly doped poly-silicon or amorphous silicon. Lattice defects may also be formed by implantation. Furthermore, deep traps formed by implantation of Au, Cu or Pt into a semiconductor material of the floating field plates 7 and/or at the interface between the floating field plates 7 and the respective insulating region 8 may be used as charge generation centers. Even further, the floating field plates 7 may include one or more cavities. The interface between the semiconductor material and a cavity may also form a generation center for electron-hole pairs.

In the event of a reverse voltage exceeding the nominal reverse off-voltage $U_{off}$, electron-hole pairs are generated at the charge generating centers of the floating field plates 7 and separated in the electric field. While the holes move in the electric field towards the source metallization and the first surface 101, respectively, the generated electrons remain trapped in the floating field plates 7 due to the insulating regions 8. The generation of electron-hole pairs stops when the floating field plates 7 are sufficiently charged and substantially field-free. The trapped charges provide the counter charges for the fixed charges of the depleted portion of the third semiconductor layer 3. The insulating regions 8 may partly insulate the floating field plates 7 also on top.

In the exemplary embodiment illustrated in FIG. 1, the floating field plates 7 which are partially insulated by respective ones of the insulating regions 8 form self-charging electron traps 7, 8. In other embodiments in which the third semiconductor layer 3 is of p-type, self-charging hole traps 7, 8 are provided by the partially insulated floating field plates 7.

When the semiconductor device 100 is switched again in forward current direction, the charged floating field plates 7 are again discharged to maintain low on-resistance $R_{on}$.

In the vertical cross-section, the floating field plates 7 and self-charging charge traps 7, 8, respectively, have typically a larger vertical extension compared to a maximum horizontal extension. The insulating regions 8 may be substantially U-shaped but also substantially V-shaped in the vertical cross-section.

Figure 3:
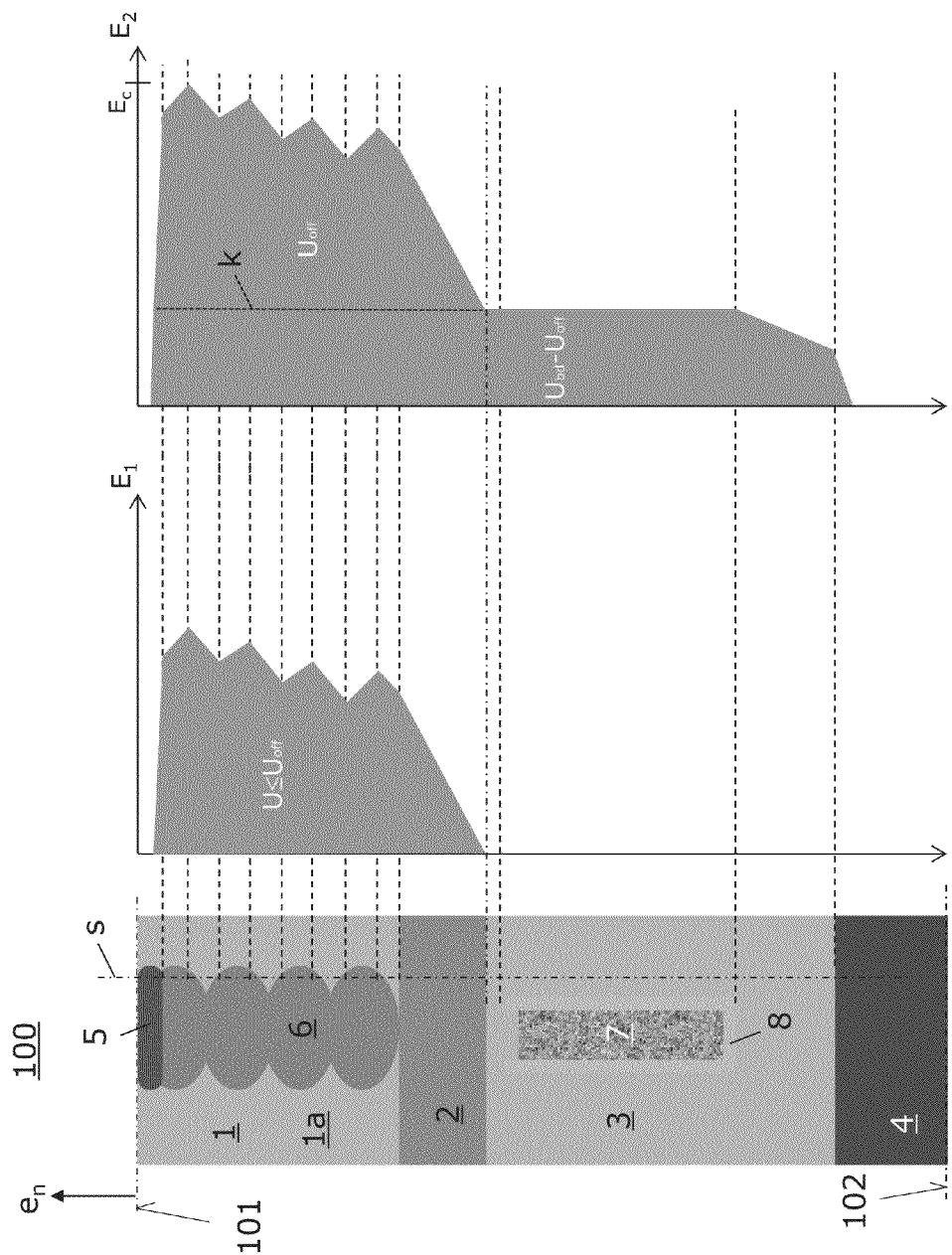
FIG. 3 illustrates vertical electric field distributions of the semiconductor device illustrated in FIG. 1 according to embodiments.

According to an embodiment, the self-charging charge traps 7, 8 extend substantially to a drain layer 4. FIG. 3 illustrates electric field distributions of the semiconductor device 100 illustrated in FIG. 1 during the blocking-mode along a vertical line 's' which runs partly through one of the compensation regions 6. When a reverse voltage U at or below the nominal reverse off-voltage $U_{off}$ ($U \leq U_{off}$) is applied between the drain metallization and the source metallization, the reverse voltage U substantially drops across the first semiconductor layer 1 and the second semiconductor layer 2. This can be inferred from the electric field distribution $E_1$. Note that the voltage drop corresponds to a line integral of the electric field along path s. At reverse voltage U above the nominal reverse off-voltage $U_{off}$, the second semiconductor layer 2 is punched through and a portion of the reverse voltage U drops across the third semiconductor layer 3. This is illustrated for an electric field distribution $E_2$ corresponding to applying the breakdown voltage $U_{db}$ between the drain metallization and the source metallization. In this case the critical field strength $E_c$ is reached in the semiconductor body and the voltage drop below the second semiconductor layer 2 is about $U_{db}-U_{off}$. Note that the area which is right of the dashed line k, i.e. between the dashed line k and the curve representing the electric field distribution $E_2$ corresponds to the nominal reverse off-voltage $U_{off}$.

Figure 4:
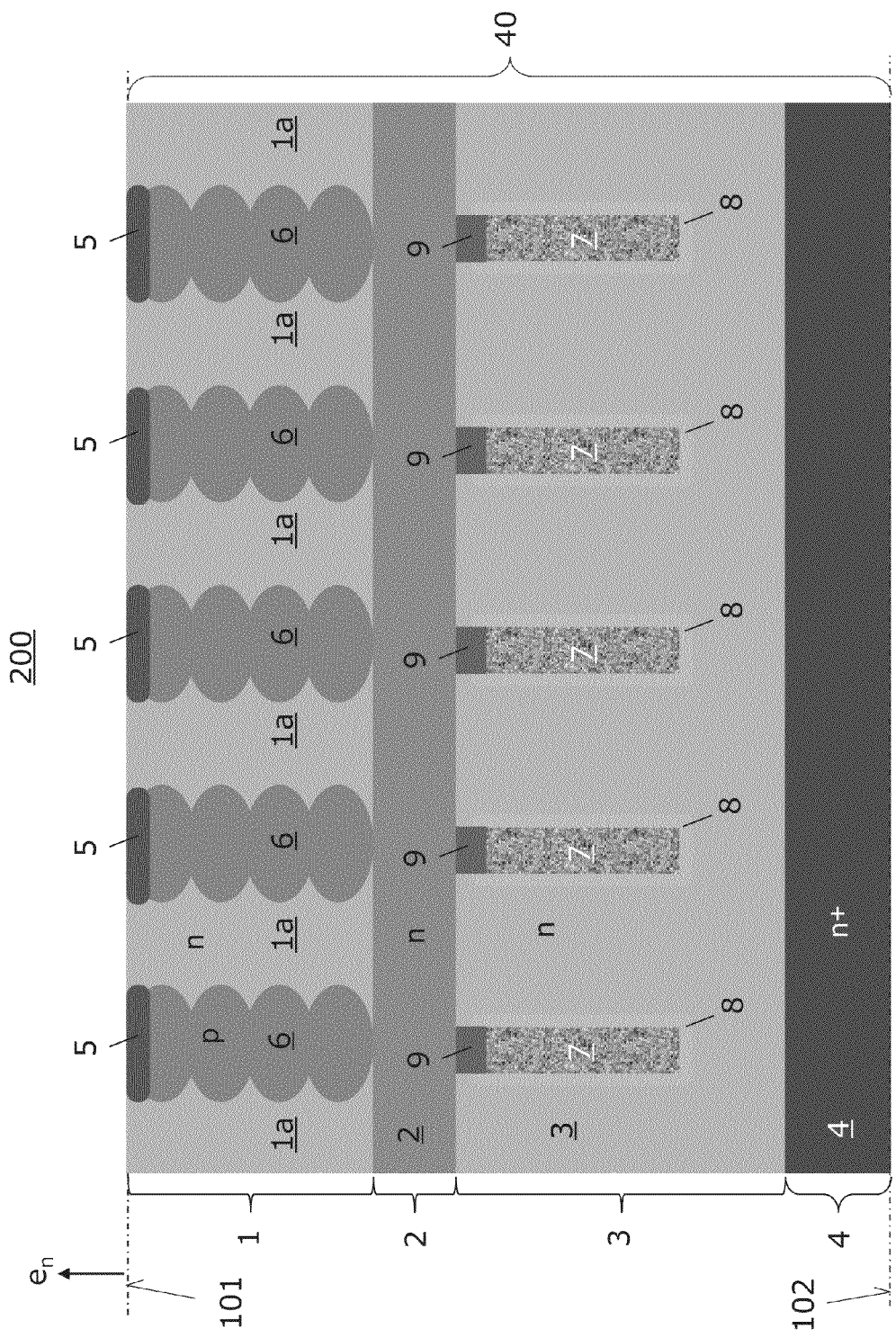
FIG. 4 illustrates a vertical cross-section through a semiconductor body of a semiconductor device according to an embodiment.

FIG. 4 illustrates a vertical cross-section through a semiconductor body 40 of a semiconductor device 200. The semiconductor device 200 shown in FIG. 4 is similar to the semiconductor device 100 explained above with regard to FIGS. 1 to 3. However, p-type floating semiconductor regions 9 are arranged above and in contact with a respective floating field plate 7. Accordingly, the floating field plates 7 are not in direct contact with the third semiconductor layer 3 but in electric contact via respective pn-junctions formed between the third semiconductor layer 3 and the p-type floating semiconductor regions 9. In other embodiments, the p-type floating semiconductor regions 9 are slightly displaced to the floating field plates 7. This facilitates complete discharging of the charged floating field plates 7 when the semiconductor device 200 is switched again in forward-current direction. Alternatively, complete discharging of the charged floating field plates 7 may be facilitated by arranging interrupted p-type floating semiconductor regions 9 on the floating field plates 7. For example, the p-type floating semiconductor regions 9 may not be present in another vertical cross-section through semiconductor device 200. Due to the p-type floating semiconductor regions 9, the electric field in the third semiconductor layer 3 during the blocking-mode and high reverse voltages is increased compared to a semiconductor device without the p-type floating semiconductor regions 9.

Figure 5:
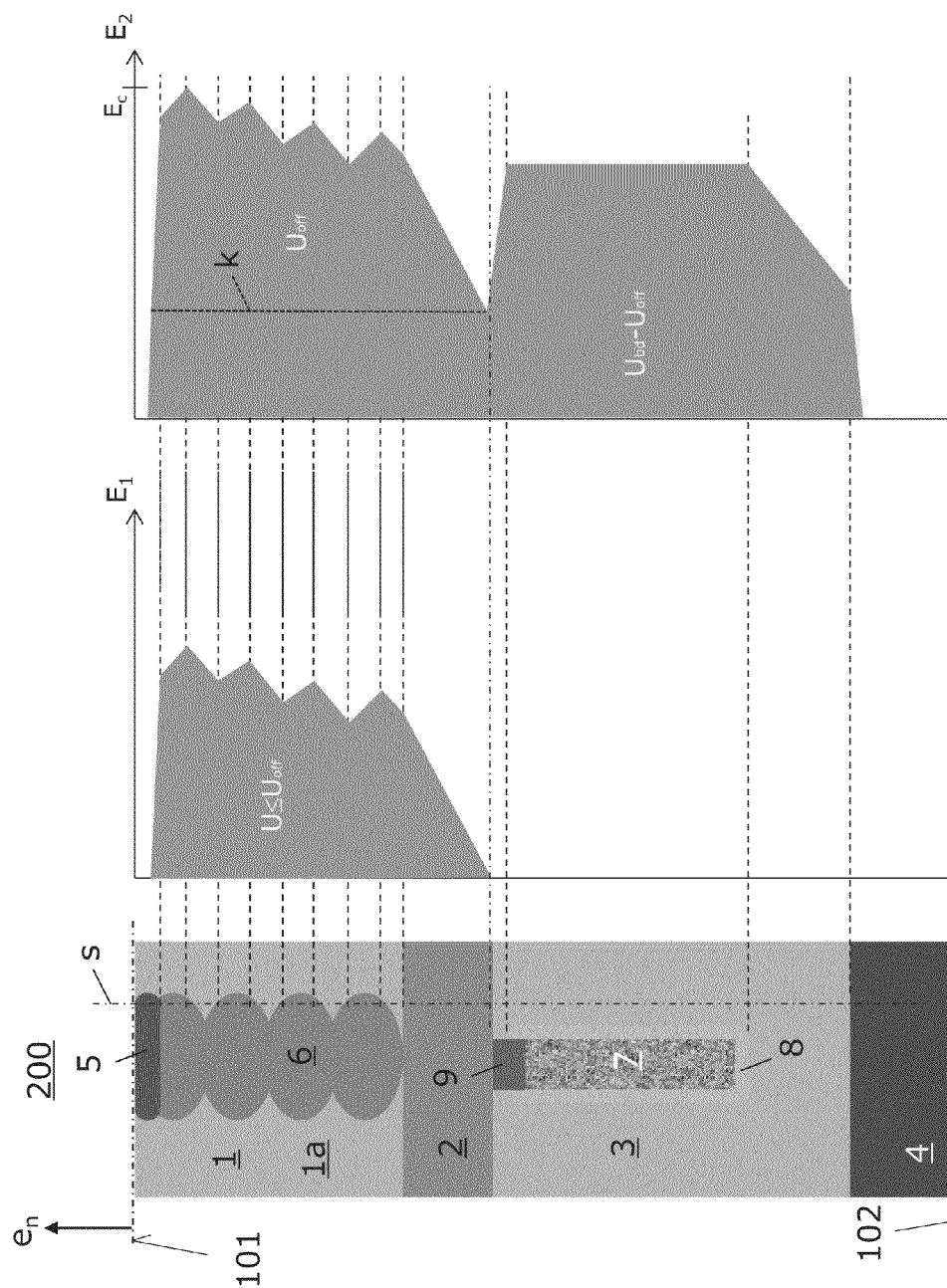
FIG. 5 illustrates vertical electric field distributions of the semiconductor device illustrated in FIG. 4 according to embodiments.

This is illustrated in FIG. 5 showing electric field distributions of the semiconductor device 200 illustrated in FIG. 4 during the blocking-mode along a vertical line 's' which runs partly through one of the compensation regions 6. When a reverse voltage U at or below the nominal reverse off-voltage $U_{off}$ ($U \leq U_{off}$) is applied between the drain metallization and the source metallization, the reverse voltage U substantially drops across the first semiconductor layer 1 and the second semiconductor layer 2 as shown by the electric field distribution $E_1$.

At reverse voltage U above the nominal reverse off-voltage $U_{off}$, the second semiconductor layer 2 is punched through and a portion of the reverse voltage U drops across the third semiconductor layer 3. This is illustrated by the electric field distribution $E_2$ corresponding to applying the breakdown voltage $U_{db}$ between the drain metallization and the source metallization. In this case the critical field strength $E_c$ is reached in the semiconductor body 40 and the voltage drop below the second semiconductor layer 2 is about $U_{db}-U_{off}$. This is similar as explained above for the semiconductor device 100 with regard to FIG. 3. However, the portion of the reverse voltage U that drops across the third semiconductor layer 3 is significantly larger for the semiconductor device 200 of FIG. 4. Accordingly, the semiconductor device 200 of FIG. 4 typically has a higher breakdown voltage $U_{db}$ compared to the semiconductor device 100 of FIG. 1 at substantially the same on-state resistance $R_{on}$.

Figure 6:
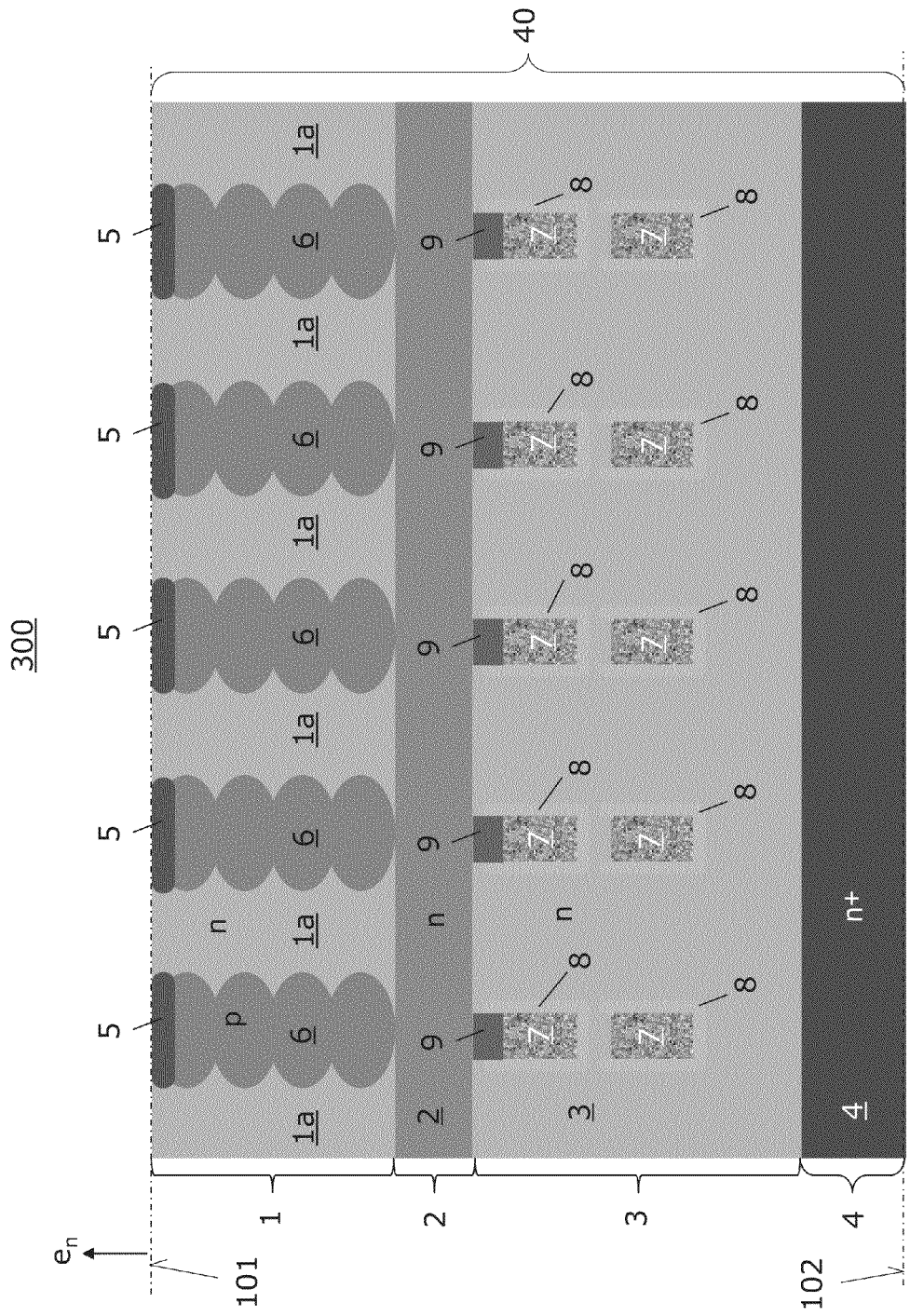
FIG. 6 illustrates a vertical cross-section through a semiconductor body of a semiconductor device according to an embodiment.

FIG. 6 illustrates a vertical cross-section through a semiconductor body 40 of a semiconductor device 300. The semiconductor device 300 shown in FIG. 6 is similar to semiconductor device 200 explained above with regard to FIGS. 4 and 5. However, each of the self-charging charge traps 7, 8 formed by respective floating field plates 7, which are partly separated from the third semiconductor layer 3 respective by dielectric regions 8, is, in the vertical direction, divided into a lower self-charging charge trap 7, 8 and an upper self-charging charge trap 7, 8. Typically, the p-type floating semiconductor regions 9 are at least arranged on the upper self-charging charge traps 7, 8. Again, the p-type floating semiconductor regions 9 may adjoin or be separated from the respective floating field plate 7 by a respective portions of the third semiconductor layer 3. Furthermore, more than two layers of self-charging charge traps 7, 8 may be arranged above one another. Even further, the pitch of the self-charging charge traps 7, 8 may differ between different layers of the self-charging charge traps 7, 8 and/or the different layers of self-charging charge traps 7, 8 may be off-set in a horizontal direction.

Figure 7:
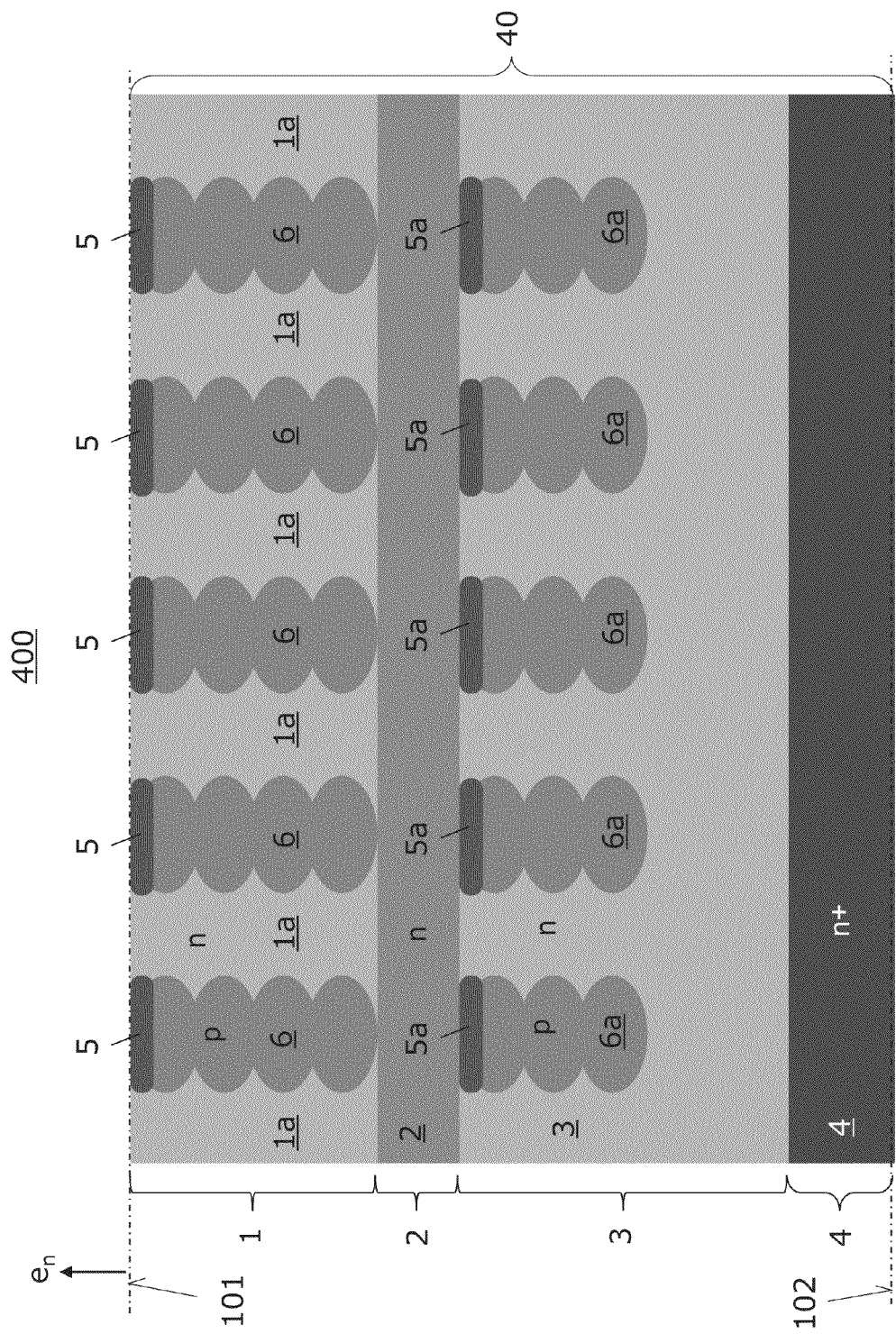
FIG. 7 illustrates a vertical cross-section through a semiconductor body of a semiconductor device according to an embodiment.

FIG. 7 illustrates a vertical cross-section through a semiconductor body 40 of a semiconductor device 400. The semiconductor device 400 shown in FIG. 7 is similar to semiconductor device 100 explained above with regard to FIGS. 1 to 3. However, floating p-type semiconductor region 5a, 6a are arranged in the third semiconductor layer 3 of the semiconductor device 400 instead of self-charging charge traps formed by floating field plates which are separated from the third semiconductor layer 3 at side and bottom sides by a dielectric region.

In the exemplary embodiment illustrated in FIG. 7, the floating p-type semiconductor regions 5a, 6a have the same pitch and are vertically centered with respect to the compensation regions 6 and body regions 5, respectively. The floating p-type semiconductor region 5a, 6a may however also be horizontally off-set with respect to the compensation regions 6 and body regions 5, respectively, and or have a different pitch.

Similar as explained above with regard to FIGS. 1 to 3 for the semiconductor device 100, the space charge region formed during the blocking-mode in the first semiconductor layer 1 of the semiconductor device 400 does not extend through the second semiconductor layer 2 at reverse voltages up to the nominal reverse off-voltage $U_{off}$. Only when the reverse voltage exceeds the nominal reverse off-voltage $U_{off}$, the second semiconductor layer 2 is punched through. In this case, the third semiconductor layer 3 is at first horizontally depleted between the floating p-type semiconductor regions 5a, 6a.

The maximum doping concentration of the floating p-type semiconductor regions 5a, 6a may substantially match the maximum doping concentration of the compensation regions 6 and body regions 5, respectively. However, this may depend on the ratio between nominal reverse off-voltage $U_{off}$ and breakdown voltage $U_{bd}$. The maximum doping concentrations of the upper floating p-type semiconductor regions 5a and the lower floating p-type semiconductor regions 6a may substantially match.

When the third semiconductor layer 3 is horizontally depleted between the floating p-type semiconductor regions 5a, 6a, electrons and holes are typically discharged into the drain metallization and source metallization, respectively. When the semiconductor device 400 is subsequently switched to forward current mode, the floating p-type semiconductor regions 5a, 6a may still be charged. Accordingly, the on-resistance $R_{on}$ may be increased. Through-punching of the second semiconductor layer 2 happens however only in rare events and the floating p-type semiconductor regions 5a, 6a are recharged in subsequent switching cycles with thermally generated charge carriers. Accordingly, the time-averaged on-resistance $R_{on}$ is at most only slightly increased while the switching losses are significantly reduced compared to conventional compensation MOSFETs.

In the exemplary embodiment illustrated in FIG. 7, the floating p-type semiconductor regions 5a, 6a are, in the vertical cross-section, formed as substantially vertically orientated pillars. In other embodiments, the floating p-type semiconductor regions 5a, 6a are, in the vertical cross-section, formed as substantially orientated strip-type parallelepipeds. Different to the compensation regions 6 and body regions 5, there is no low resistivity current path between the floating p-type semiconductor regions 5a, 6a and the source metallization or any other terminal provided. The floating p-type semiconductor regions 6a may be higher doped than the compensation regions 6 as the floating p-type semiconductor regions 6a are typically not depleted in the blocking-mode.

Figure 8:
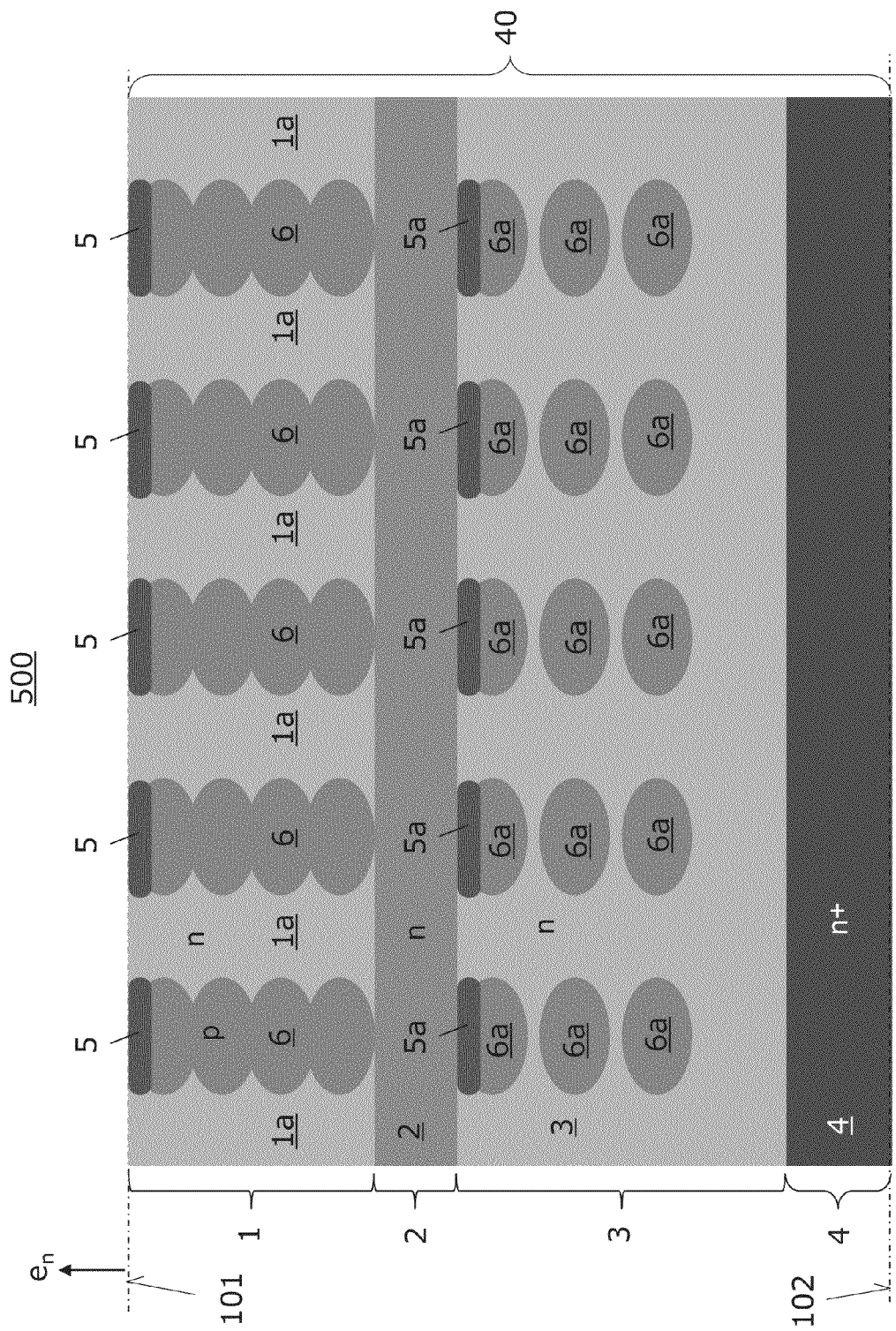
FIG. 8 illustrates a vertical cross-section through a semiconductor body of a semiconductor device according to an embodiment.

According to an embodiment, bubble-shaped p-type floating semiconductor regions 6a are arranged in the third semiconductor layer 3 instead of pillar-shaped p-type floating semiconductor regions 6a. This is illustrated in FIG. 8 which corresponds to a vertical cross-section through a semiconductor body 40 of a similar semiconductor device 500.

To improve discharging of the floating p-type semiconductor regions 5a, 6a explained above with regard to FIGS. 7 and 8, discharge structures may be provided. For example, $n^+$-type contact regions in contact with the third semiconductor layer 3 may adjoin the p-type semiconductor regions 6a. Furthermore, charge generation centers, such as lattice defects or impurities, for generating electron-hole pairs in an electric field may be provided at and/or close to a pn-junction formed between the p-type semiconductor regions 6a and respective $n^+$-type contact regions. For example, a silicide, a poly-silicon or an amorphous silicon region may be embedded between each of the p-type semiconductor regions 6a and a respective $n^+$-type contact region. Alternatively, an n-type subregion may be arranged in an upper portion of some or all floating p-type semiconductor regions 6a. The n-type subregion is typically connected with the respective p-type semiconductor region 6 via a respective metal or silicide region. Furthermore, charge generation centers may be formed in some or all floating p-type semiconductor regions 6a.

Figure 9:
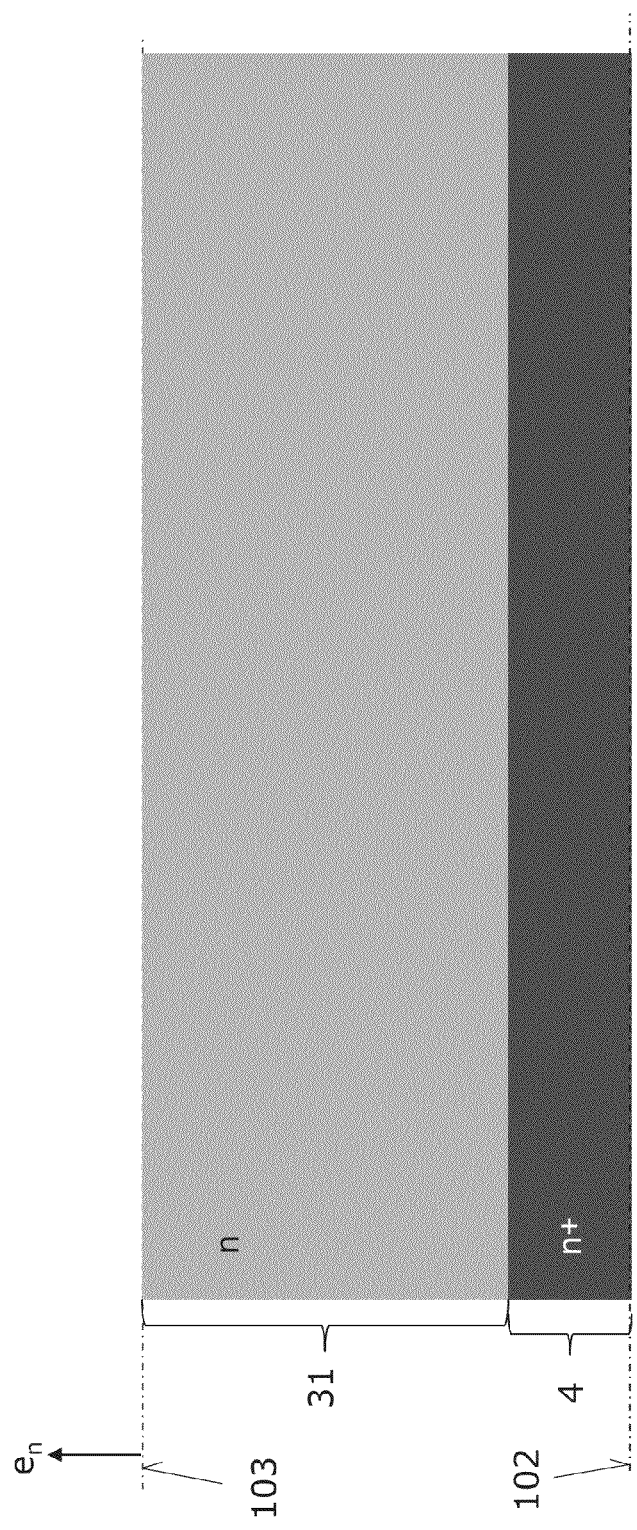
FIGS. 9 to 12 illustrate vertical cross-sections through a semiconductor body during method steps of a method according to further embodiments.

Alternatively, high resistivity weakly p-doped semiconductor regions may connect the p-type semiconductor regions 6a with respective compensation regions 6 to improve discharging during the blocking-mode. The doping concentration of the weakly p-doped semiconductor regions is typically chosen such that they are completely depleted at low reverse voltages, of for example less than about 10% of the rated blocking voltage or even less than about 3% of the rated blocking voltage FIGS. 9 to 12 illustrate a method for forming a semiconductor device 100 according to several embodiments in vertical cross-sections. These figures show vertical cross-sections through a semiconductor body during or after particular method steps. In a first process, a semiconductor body, for example a wafer or substrate, having a top surface 103 and a second or backside surface 102 opposite the top surface 103 is provided. The normal direction $e_n$ of the top surface 103 is substantially parallel to the vertical direction. As illustrated in FIG. 9, the semiconductor body typically includes an $n^+$-type fourth semiconductor layer 4 which extends to the second surface 102 and typically forms a drain layer in the semiconductor device to be produced. An n-type semiconductor layer 31 is arranged on the fourth semiconductor layer 4 and extends to the top surface 103.

Figure 10:
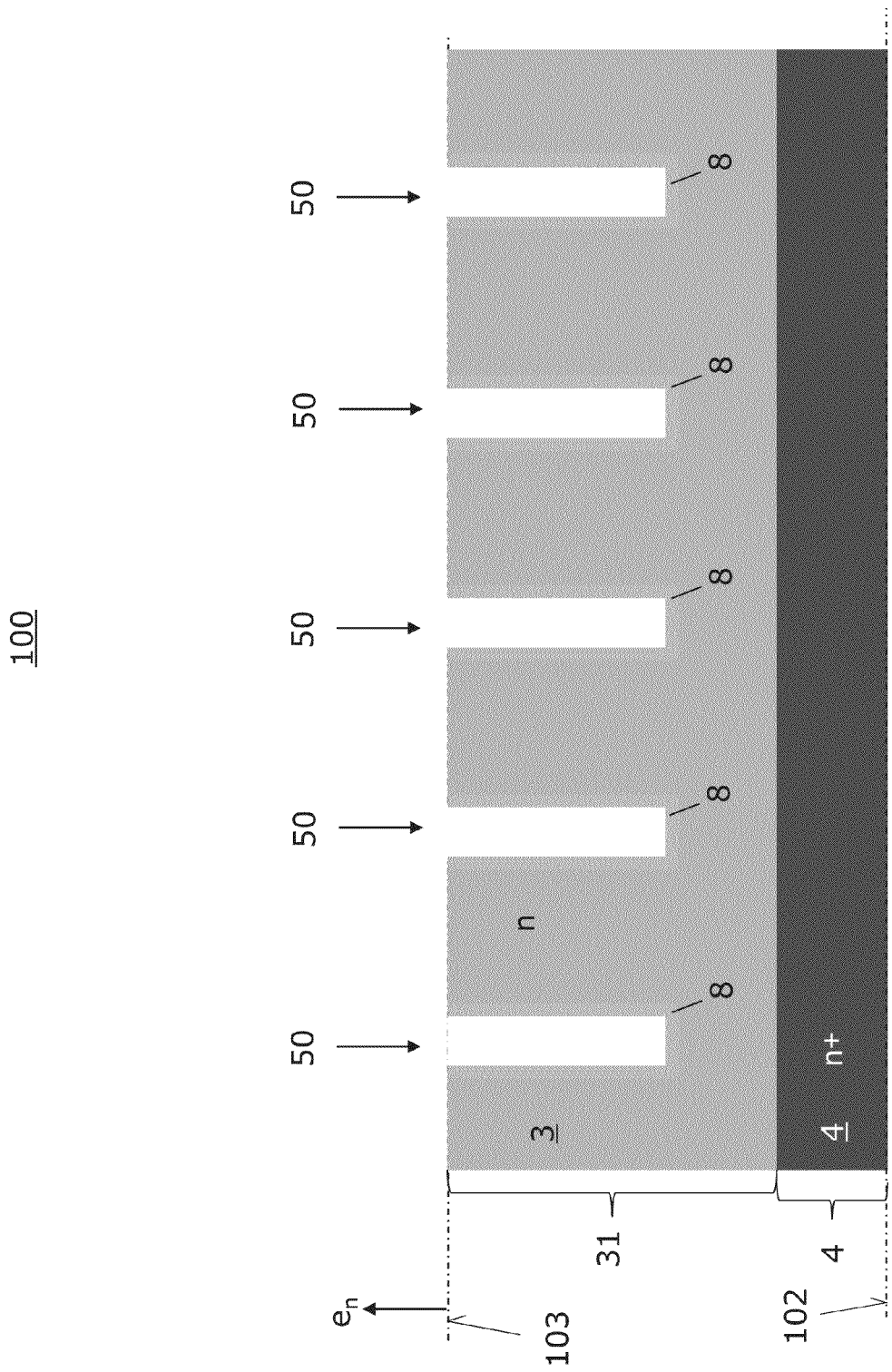

Referring to FIG. 10, vertical trenches 50 are etched from the top surface 103 into semiconductor layer 31. Further, the side walls and bottom wall of the vertical trenches 50 are insulated by dielectric regions 8. This may be done by deposition and/or thermal oxidation and removal of the formed dielectric layer from the top surface 103. Alternatively, a dielectric layer or a hardmask used for forming vertical trenches 50 may be used as etch-stop for forming field plates and be removed thereafter.

Figure 11:
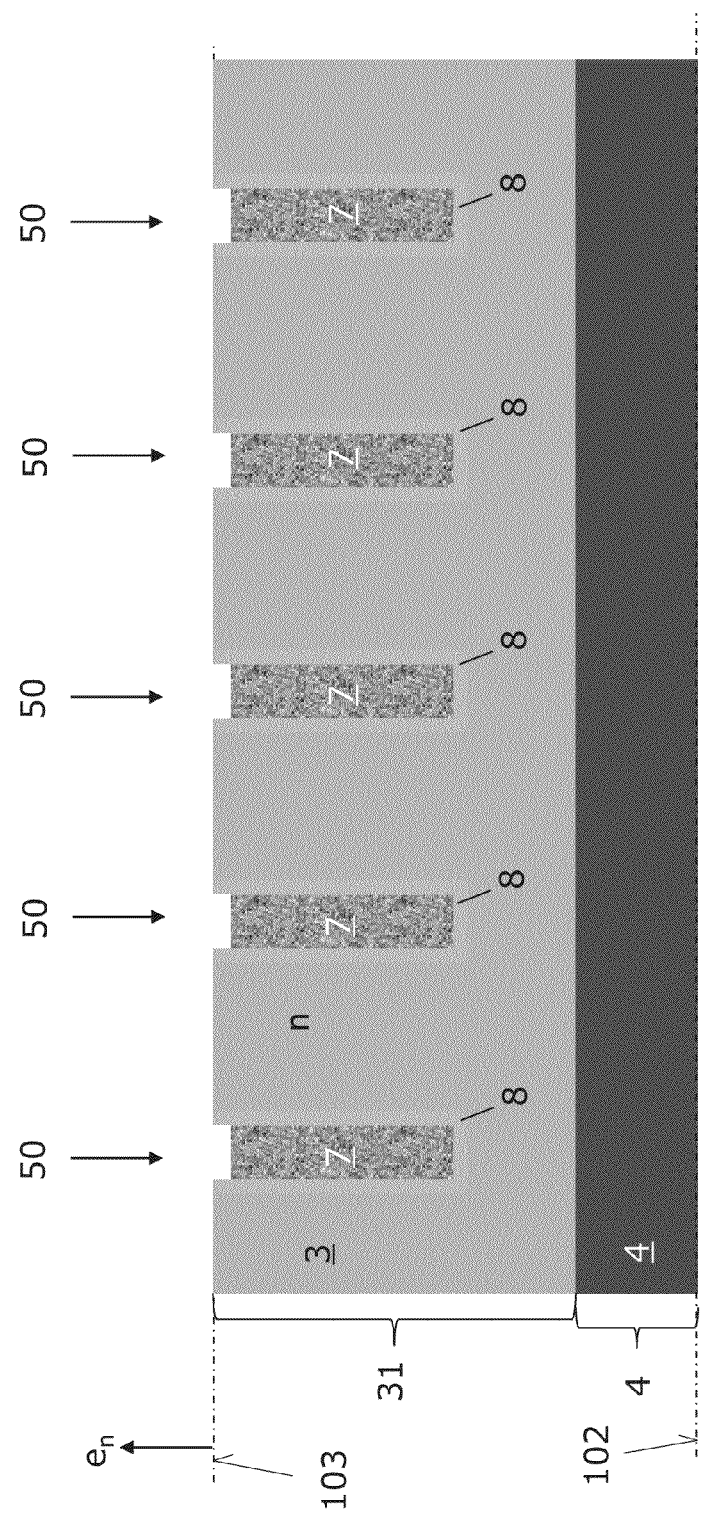

Referring to FIG. 11, field plates 7 are formed in the vertical trenches 50. Forming the field plates 7 may include depositing a conductive material such as a metal like wolfram, a highly doped poly-crystalline silicon, a highly doped amorphous silicon or a highly doped porous silicon, and back-etching of the deposited conductive material.

Typically, the field plates 7 are formed such that charge generation centers are included in the field plates 7. For example, lattice defects may be formed in the conductive material by implantation. Alternatively or in addition, deep traps may be formed by implanting Au, Cu or Pt into a deposited semiconductor material of the floating field plates 7 and/or at the interface between the floating field plates 7 and the respective insulating region 8.

Figure 12:
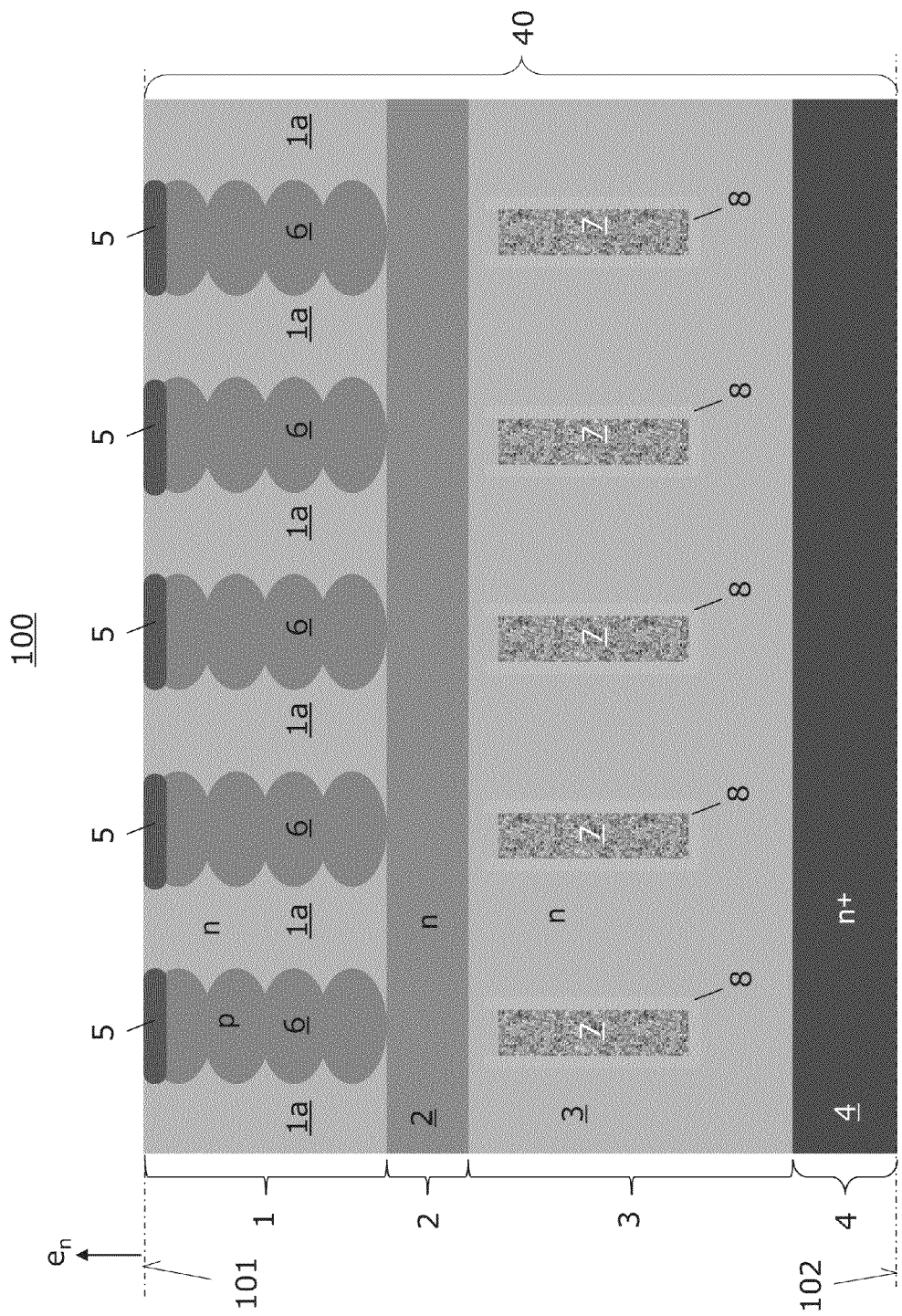

Thereafter, several epitaxial layers are typically deposited on the top surface 103 and ion implantation processes are performed to form a third semiconductor layer 3 by increasing the vertical thickness of semiconductor layer 31, a second semiconductor layer 2 arranged on the third semiconductor layer 3 and a first semiconductor layer 1 arranged on the second semiconductor layer 2, and to from compensations regions 6 and body regions 5 in the first semiconductor layer 1. The resulting semiconductor structure 100 is illustrated in FIG. 12. Typically, the compensation regions 6 are formed as substantially vertically orientated pillars or substantially vertically orientated strip-type parallelepipeds.

Ion implantation processes are typically performed with an integral ion dose such that remaining portions 1a of the first semiconductor layer 1 forming drift regions are substantially depleted when a reverse voltage of about nominal reverse off-voltage $U_{off}$, which is lower than a rated breakdown voltage of the semiconductor device, is applied across the semiconductor body 40 in reverse current direction which corresponds to reverse biasing the pn-junctions formed between the compensation regions 6 and drift region 1a.

The second semiconductor layer 2 is typically formed with a doping charge per horizontal area which is lower than a breakdown charge per area of the deposited semiconductor material.

Optionally, p-type floating semiconductor regions may be formed in the third semiconductor layer 3 above the floating field plates 7.

Thereafter $n^+$-type source regions, p-type body regions and $p^+$-type body contact regions may be formed by implantations. Further, insulated gate electrodes are typically formed on the first surface 101 to which the first semiconductor layer 1 extends. An interlayer dielectric is typically formed on the first surface 101 and recessed above the source and body regions. The resulting semiconductor device 100 is illustrated in FIGS. 1, 2.

Thereafter, a source metallization is formed on the first surface 101 in low resistivity contact with the source regions, body contact regions and thus with the body regions and compensation regions 6. To form a three-terminal MOSFET, a drain metallization is deposited on the second surface 102.

Semiconductor devices as illustrated in FIGS. 7 and 8 may be formed likewise. However, instead of forming field plates in trenches as explained above with regard to FIGS. 10 and 11, floating p-type semiconductor regions are formed, for example by implantation.

Typically, a sub-region with lattice defects is formed in at least one of the floating p-type semiconductor regions. Further, an $n^+$-type contact region may be formed adjoining the at least one floating p-type semiconductor region, its sub-region and the third semiconductor layer 3 or embedded in the at least one floating p-type semiconductor region.

According to an embodiment, the formed semiconductor device includes a semiconductor body having a first surface defining a vertical direction and a source metallization arranged on the first surface. In a vertical cross-section the semiconductor body further includes: a drift region of a first conductivity type; at least two compensation regions of a second conductivity type each of which forms a pn-junction with the drift region and is in low resistive electric connection with the first metallization; and a third semiconductor layer of the first conductivity type which is arranged below the drift region and includes at least one of a floating field plate, a self-charging charge trap and a floating semiconductor region of the second conductivity type forming a pn-junction with the third semiconductor layer.

Typically, a second semiconductor layer made of a semiconductor material of the first conductivity type is arranged between and adjoining the drift region and the third semiconductor layer and has a doping charge per horizontal area which is lower than a breakdown charge per area of the semiconductor material.

Typically, the formed semiconductor device is a vertical MOSFET, more typically a vertical power MOSFET, with the first metallization forming a source metallization. A drain metallization may be formed and arranged, respectively, opposite to the source metallization. Alternatively, the drain metallization may be formed and arranged, respectively, on the first surface to form a so-called drain-up MOSFET. In a drain-up MOSFET, a highly doped buried layer of the first conductivity type is typically arranged below the third semiconductor layer and is in low resistive electric connection with the drain metallization via a highly doped sinker region of the first conductivity type.

In another embodiment, the formed semiconductor device is a lateral MOSFET, more typically a lateral power MOSFET. In this embodiment, the drift region, the second semiconductor layer and the third semiconductor layer are, in the vertical cross-section, arranged side by side. In this embodiment, the first metallization forms a source metallization and a drain metallization and a gate metallization are typically also arranged on the first surface. Furthermore, the floating field plates and the self-charging charge traps, respectively, are, in the vertical cross-section, typically rotated by about 90° compared to their orientation in vertical MOSFETs as illustrated above in FIGS. 1, 3 to 6, 11 and 12.

According to an embodiment, the formed semiconductor device includes a semiconductor body including: a first surface defining a vertical direction; a first semiconductor layer extending to the first surface and comprising a pn-compensation-structure; a second semiconductor layer comprised of a semiconductor material of a first conductivity type, arranged below the first semiconductor layer and having a doping charge per horizontal area which is lower than a breakdown charge per area of the semiconductor material; and a third semiconductor layer of the first conductivity type arranged below the second semiconductor layer and including at least one of a floating field plate, a self-charging charge trap and a semiconductor region of a second conductivity type forming a pn-junction with the third semiconductor layer.

Figure 13:
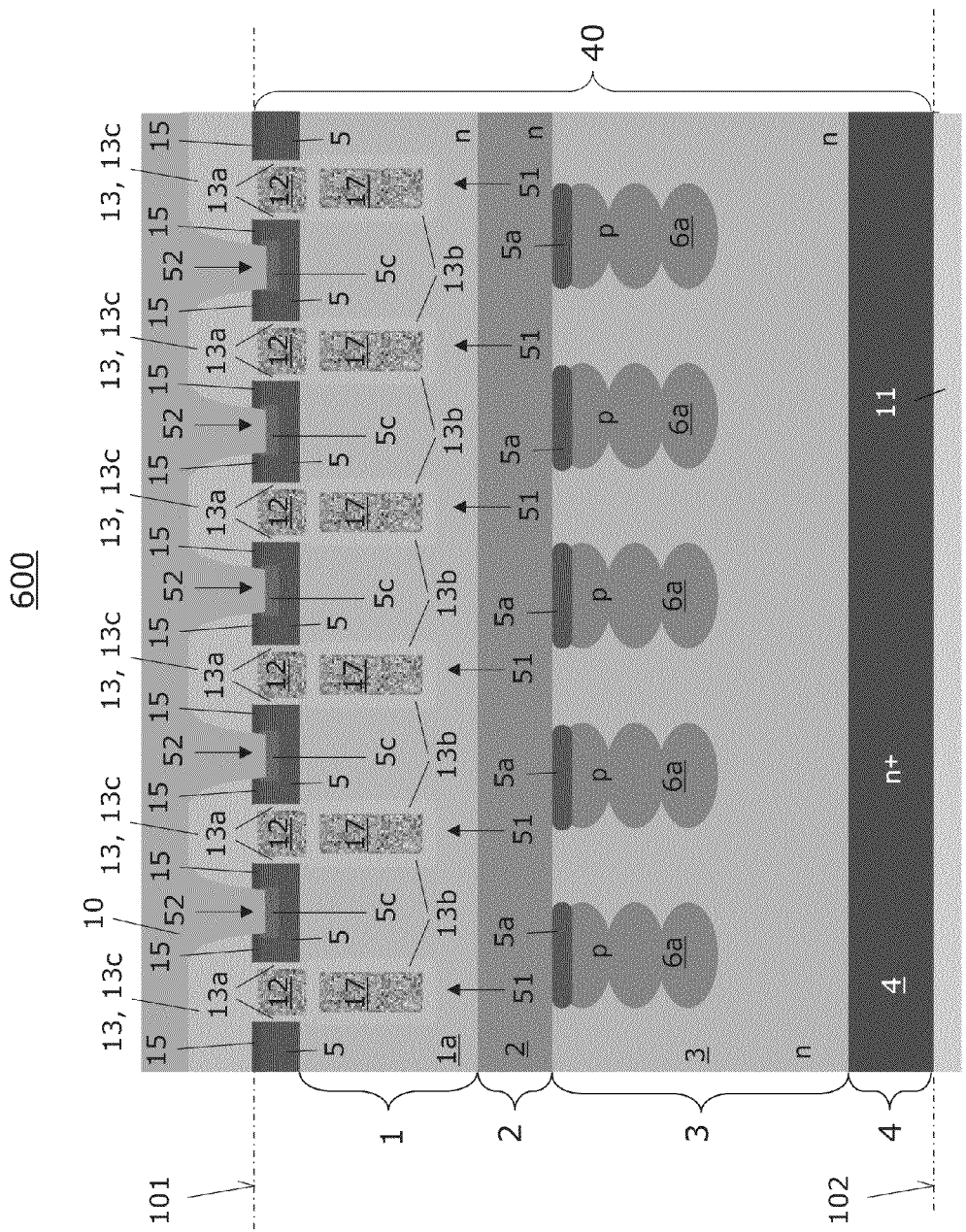
FIG. 13 illustrates a vertical cross-section through a semiconductor body of a semiconductor device according to an embodiment.

FIG. 13 illustrates a vertical cross-section through a semiconductor body 40 of a semiconductor device 600. The semiconductor device 600 shown in FIG. 13 is similar to the semiconductor device 400 explained above with regard to FIG. 7. However, instead of arranging a plurality of p-type compensation regions in the first semiconductor layer 1 to form a pn-compensation structure, a trench field-plate compensation structure is formed in the first semiconductor layer 1 of the semiconductor device 600.

In the exemplary embodiment illustrated in FIG. 13, several vertical trenches 51 extend from the first surface 101 through an n-type source layer 15, an adjoining p-type body layer 5 and partly into the adjoining n-type first semiconductor layer 1 typically forming the drift region 1*a* of the semiconductor device 600. Further, shallow trenches 52 extend between adjacent vertical trenches 51 from the first surface 101 through the n-type source layer 15 partly into the body layer 5. Accordingly, the source layer 15 and the body layer 5 are divided by the trenches 51, 52 into separated source regions 15 and body regions 5, respectively. In the exemplary embodiment, each of the body regions 5 adjoins two spaced apart source regions 5.

Each vertical trench 51 includes in an upper portion a gate electrode 12 which is insulated from the semiconductor body 40 by a gate dielectric region 13*a* and in a lower portion a field plate 17 which is in low ohmic contact with the source metallization 10 arranged on the first surface 101 and insulated from the drift region 1*a* by a field dielectric layer 13*b* and insulated from the gate electrode 12. In other embodiments, the gate electrodes 12 and the gate dielectric regions 13*a* are formed on the first surface 101.

Portions 13*a* of the dielectric regions 13 are arranged on the first surface 101 and between the source metallization 10 and a respective gate electrode 12 which extends in the vertical direction along a respective gate dielectric region 13*a* from the drift region 1*a* at least partly to a respective source region 15 so that an inversion channel may be formed by the field-effect in the adjoining body region 5. Accordingly, the semiconductor device 600 may also be operated as a MOSFET.

Typically, the semiconductor device 600 is a power semiconductor device with a plurality of unit cells and vertical trenches 51 defining the unit cells, respectively, in its active area. Note that the vertical trenches 51 may, for example, be substantially bar-shaped and form a one-dimensional or two-dimensional lattice, but may also be ring-shaped when seen from above.

The portions 13*c* of the dielectric region 13 form an interlayer dielectric 13*c* between the source metallization 10 and gate electrode 12.

In the exemplary embodiment, the source metallization 10 electrically contacts the source regions 15 and the body contact regions 5*c* via higher doped body contact regions 5*c* and shallow trench contacts formed through the interlayer dielectric 13 and into the semiconductor body 40. In other embodiments, the source metallization 10 electrically contacts the source regions 15 and the body contact regions 5*c* at or substantially close to the first surface 101.

The field plates 17 may be connected to the source metallization 10 via similar trench contacts in another vertical cross-section through the semiconductor body 40. Furthermore, the gate electrodes 12 may be connected to a gate metallization (not shown in FIG. 13) via respective contacts in another vertical cross-section through the semiconductor body 40.

Due to the insulated trench field plates 17, which are disposed in the drift region 1*a* and during device operation on or at least substantially close to the source potential, charges in the field plates 17 and in portions of the drift region 1*a* which are arranged between pairs of adjacent field plates 17 can be mutually depleted during reversely biasing the pn-junction formed between the drift region 1*a* and the body regions in a blocking mode (off-state and during reverse bias), while in the on-state a low-resistive conduction path may be formed from the source metallization 10 to a drain metallization 11 typically in low ohmic contact with the drift region 1*a*. Accordingly, a field-plate compensation-structure is formed in the first semiconductor layer 1 of semiconductor device 600 instead of a pn-compensation structure as explained above with regard to FIGS. 1 to 8.

The drain metallization 11 is typically in low ohmic contact with and adjoins a drain region 4 of the first conductivity type having a maximum doping concentration higher than a maximum doping concentration of the drift region 1*a*.

Similar as explained above for the semiconductor devices 100 to 500 with regard to FIGS. 1 to 8, the semiconductor device 600 typically also includes an n-type third semiconductor layer 3 which is arranged between the drain region 4 and the drift region 1*a* and the first semiconductor layer 1, respectively.

According to an embodiment, a further charge compensation-structure, typically a floating compensation-structure is formed in the third semiconductor layer 3.

In the exemplary embodiment illustrated in FIG. 13, the third semiconductor layer 3 includes several floating p-type semiconductor regions 5*a*, 6*a* which form respective pn-junctions with the third semiconductor layer 3. Note that there is no low ohmic current path between the floating p-type semiconductor regions 5*a*, 6*a* and the source metallization 11 or any other terminal provided.

In other embodiments, self-charging charge traps and/or floating field plates similar as explained above with regard to FIGS. 1 to 6 are arranged in the third semiconductor layer 3 instead or in addition to the floating p-type semiconductor regions 5*a*, 6*a*.

The floating p-type semiconductor regions 5*a*, 6*a* may have the same or a different pitch than the field plates 17 and vertical trenches 51, respectively.

In the exemplary embodiment illustrated in FIG. 13, the floating p-type semiconductor regions 5*a*, 6*a* are horizontally off-set with respect to the field plates 17 and vertical trenches 51, respectively. The floating p-type semiconductor region 5a, 6a may however also be centered with respect to the field plates 17 and vertical trenches 51, respectively.

In the exemplary embodiment illustrated in FIG. 13, the floating p-type semiconductor regions 5a, 6a are, in the vertical cross-section, formed as substantially vertically orientated pillars. In other embodiments, the floating p-type semiconductor regions 5a, 6a are, in the vertical cross-section, formed as substantially orientated strip-type parallelepipeds. Furthermore, several spaced apart bubble-shaped floating p-type semiconductor regions 6a may be arranged below each other as explained above with regard to FIG. 8. Each of the bubble-shaped floating p-type semiconductor regions 6a may adjoin a respective and typically higher doped upper floating p-type semiconductor regions 5a.

According to an embodiment, a second n-type semiconductor layer 2 is arranged between and adjoining the drift region 1a and the third semiconductor layer 3 and has a doping charge per horizontal area which is lower than a breakdown charge per area of the semiconductor material of semiconductor layer 2 and the semiconductor body 40, respectively.

Similar as explained above with regard to FIGS. 1 to 8 for the semiconductor devices 100 to 500, a space charge region formed during the blocking-mode in the first semiconductor layer 1 of the semiconductor device 600 does not extend through the second semiconductor layer 2 at reverse voltages up to the nominal reverse off-voltage $U_{off}$. Only when the reverse voltage exceeds the nominal reverse off-voltage $U_{off}$, the second semiconductor layer 2 is punched through. In this case, the third semiconductor layer 3 is at first horizontally depleted between the floating p-type semiconductor regions 5a, 6a.

When the third semiconductor layer 3 is horizontally depleted between the floating p-type semiconductor regions 5a, 6a, electrons and holes are typically discharged into the drain metallization 11 and source metallization 10, respectively. When the semiconductor device 600 is subsequently switched to forward current mode, the floating p-type semiconductor regions 5a, 6a may in some applications still be charged. Accordingly, the on-resistance $R_{on}$ may be increased. Through-punching of the second semiconductor layer 2 may happen however only in rare events in these applications and the floating p-type semiconductor regions 5a, 6a be recharged (discharged) in subsequent switching cycles with thermally generated charge carriers. Accordingly, the time-averaged on-resistance $R_{on}$ is at most only slightly increased while the switching losses are significantly reduced compared to conventional compensation MOSFETs.

Furthermore and as will be explained below with regard to FIG. 16, there are applications such as driving an inductive load, for example an electric motor, in which the MOSFETs are regularly driven in a reversed conducting mode. As this will result in regular recharging of the floating p-type semiconductor regions 5a, 6a, the on-resistance $R_{on}$ may not be substantially increased at all even if no additional discharge structures as explained above with regard to FIGS. 7 and 8 are provided.

The semiconductor device 600 may be fabricated similar as explained above with regard to 9 to 12. In a first process, a semiconductor body of a first conductivity type having a top surface defining a vertical direction and a backside surface arranged opposite the top surface may be provided.

Thereafter, spaced apart floating semiconductor region of a second conductivity type each of which forms a pn-junction within the semiconductor body are formed.

Alternatively, several spaced apart floating trench field plates which are partly separated from the semiconductor body by a dielectric region may be formed form the top surface in the semiconductor body.

Thereafter, at least two semiconductor layers of the first conductivity type may be formed on the top surface by epitaxial depositing. In an upper semiconductor layer, for example an uppermost semiconductor layer, of the at least two semiconductor layers a trench field-plate compensation-structure is formed. This may include forming vertical trenches into the semiconductor body, insulating the side walls and bottom walls of the vertical trenches with a dielectric layer, for example a silicon oxide layer, forming a conductive region, for example a doped poly-silicon region, in a lower portion of each of the vertical trenches and forming a further dielectric layer on the conductive regions. Accordingly, trench field-plates which are insulated from the semiconductor body are formed.

Alternatively, a pn-compensation-structure may be formed by forming spaced apart compensation regions of the second conductivity type in the uppermost semiconductor layer.

Thereafter, a first metallization may be formed above the at least two semiconductor layers and in ohmic contact with the conductive regions and the spaced apart compensation regions, respectively.

The semiconductor device 100 to 600 explained above with regard to FIGS. 1 to 8 and 13 have in common that their semiconductor body 40 includes: a first semiconductor layer 1 with a compensation-structure 6, 17, 13b; a second semiconductor layer 2 which adjoins the first semiconductor layer 1, is made of a semiconductor material of a first conductivity type, and has a doping charge per horizontal area which is lower than a breakdown charge per area of the semiconductor material; a third semiconductor layer 3 of the first conductivity type adjoining the second semiconductor layer 2 and having one or more self-charging charge traps, one or more floating field plates 7 and/or one or more typically floating semiconductor regions 9, 6a, 5a of a second conductivity type forming a pn-junction with the third semiconductor layer 3; and a fourth semiconductor layer 4 of the first conductivity type adjoining the third semiconductor layer 3 and having a maximum doping concentration which is higher than a maximum doping concentration of the third semiconductor layer 3. The first semiconductor layer 1 is arranged between the first surface 101 and the second semiconductor layer 2.

Typically, the first semiconductor layer 1 is of the first conductivity type.

According to an embodiment, the first semiconductor layer 1 includes, in a vertical cross-section, at least two spaced compensation regions 6 of a second conductivity type, typically a plurality of compensation regions 6. Each of the at least two compensation regions 6 forms a pn-junction with a first portion of the first semiconductor layer 1 which is arranged between the at least two compensation regions 6. The least two compensation regions 6 and the first portion(s) form a pn-compensation-structure with substantially compensated integral doping concentrations.

According to another embodiment, the first semiconductor layer 1 includes, in a vertical cross-section, at least two field plates 17, typically a plurality of field plates 17, each of which is separated from a first portion of the first semiconductor layer 1 by a field dielectric layer 13b. The first portion forms with the at least two field plates 17 and the respective field dielectric layers 13b a field-plate compensation-structure.

Typically, a source metallization 10 is arranged on a first surface 101 of the semiconductor body 40 and in low ohmic contact with a body region of a second conductivity type forming a pn-junction with the first semiconductor layer 1, with the at least two compensation regions 6 and with the field plates 17, respectively.

Furthermore, a drain metallization 11 is typically in low ohmic contact with the fourth semiconductor layer 4. The first semiconductor layer 1 is typically substantially depletable at a reverse voltage between the source metallization 10 and the drain metallization 11 which is lower than a rated breakdown voltage of the semiconductor device.

Typically, the self-charging charge traps, the floating field plates 7 and/or the floating semiconductor regions 9, 6a, 5a are arranged in an upper portion of the third semiconductor layer 3 which adjoins the second semiconductor layer 2. A lower portion of the third semiconductor layer 3 may be arranged below the upper portion, the self-charging charge traps, the floating field plates 7 and/or the floating semiconductor regions 9, 6a, 5a. The lower portion of the third semiconductor layer 3 may have a lower maximum doping concentration than the upper portion, but typically lower than a maximum doping concentration of the fourth semiconductor layer 4. The lower portion of the third semiconductor layer 3 may be provided to absorb high reverse voltage peaks caused by a dynamic avalanche process or a cosmic radiation event. Accordingly, the robustness of the semiconductor device may be improved. In the following, further field distributions are explained with regard to FIGS. 14 and 15.

Figure 14:
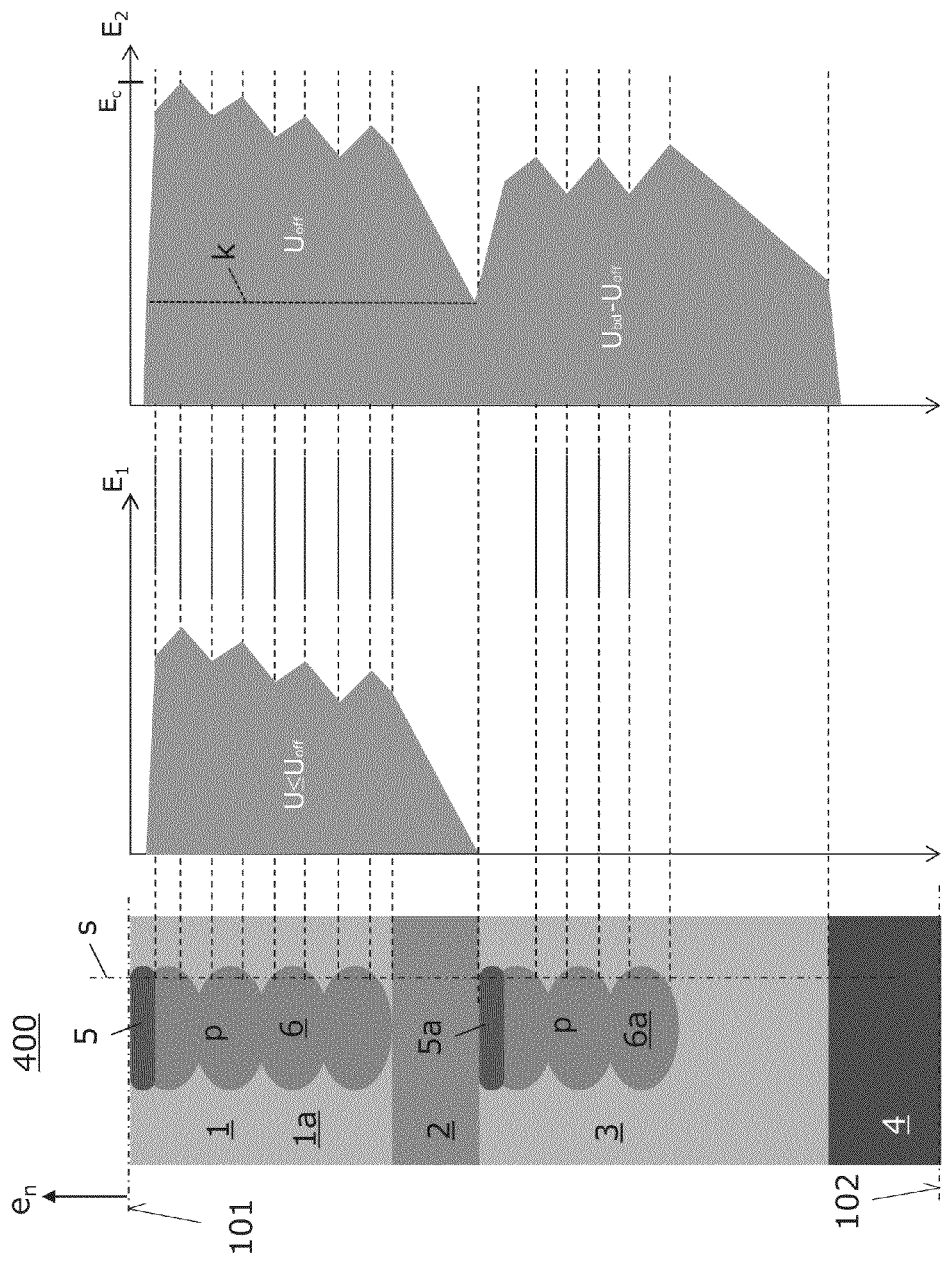
FIG. 14 illustrates vertical electric field distributions of the semiconductor device illustrated in FIG. 7 according to embodiments.

FIG. 14 illustrates vertical electric field distributions of the semiconductor device 400 illustrated in FIG. 7 during the blocking-mode along a vertical line 's' which runs partly through one of the compensation regions 6 and one floating semiconductor region 6a, 5a. When a reverse voltage U at or below the nominal reverse off-voltage $U_{off}$ ($U \leq U_{off}$) is applied between the drain metallization and the source metallization, the reverse voltage U substantially drops across the first semiconductor layer 1 and the second semiconductor layer 2. This can be inferred from the electric field distribution $E_1$ corresponding to applying the nominal reverse off-voltage $U_{off}$ between the drain metallization and the source metallization. Note that voltage drop corresponds to a line integral of the electric field along path s. At reverse voltage U above the nominal reverse off-voltage $U_{off}$, the second semiconductor layer 2 is punched through and a portion of the reverse voltage U drops across the third semiconductor layer 3. This is illustrated for an electric field distribution $E_2$ corresponding to applying the breakdown voltage $U_{db}$ between the drain metallization and the source metallization. In this case the critical field strength $E_c$ is reached in the semiconductor body above the second semiconductor layer 2. Furthermore, the portion of the voltage drop in the semiconductor body above the third semiconductor layer 3 which exceeds $U_{off}$ is substantially provided by counter charges of the body region 5.

The MOSFET 400 may be used in circuits with a designed circuit voltage $U_c$ during nominal operation which results in nominal reverse off-voltage of only about 30% to about 70% of the rated blocking voltage, for example to about 400 V for a rated blocking voltage of 650 V.

According to an embodiment, the MOSFET 400 is used in circuits in which the body-diode between the body region(s) 5 and the drift region 1a is regularly switched into forward bias. Accordingly, any stored charges in the floating semiconductor regions 5a, 6a which are due to switching voltages higher than $U_c$ (unforeseen or rare high-voltage switching-event) are discharged again during forwardly biasing the body diode. An example of such a circuit is explained below with regard to FIG. 16.

For a silicon MOSFET 400, the vertical extension of the first semiconductor layer 1 in μm may be about $U_{off}$ divided by 20 V in order to achieve a particularly trade-off between forward current losses and switching losses.

Furthermore, the second semiconductor layer 2 typically operates as a field-stop layer at an applied reverse voltage of $U_{off}$. For this purpose, a doping charge per horizontal area $q_{off}$ of the second semiconductor layer 2 is lower than a breakdown charge per area $q_c$ of the used semiconductor material. Due to the field-stop layer, the space charge region does at $U_{off}$ not extend into a vertical depth where the floating semiconductor region 6a, 5a are arranged. Thus, no further stored charges $Q_{OSS}$ are generated in the third semiconductor layer 3. Note that the maximum doping concentration of the first semiconductor layer 1 and the second semiconductor layer 2 and/or the maximum doping concentration of the second semiconductor layer 2 and the third semiconductor layer 3 may substantially match.

According to an embodiment, a doping charge per horizontal area of a higher doped p-type uppermost portion 5a of the floating semiconductor regions 6a, 5a is about the breakdown charge per area $q_c$, for example in a range from about 90% to about 110% of $q_c$. This is to achieve a high blocking capability of the lower compensation structure 3, 5a, 6a. The electric field distribution $E_2$ illustrated in FIG. 14 corresponds to a semiconductor device 400 with a doping charge per horizontal area of the uppermost portions 5a which is lower than the breakdown charge per area $q_c$. This results in a further increasing electric field strength $E_2$ (voltage drop) in the first semiconductor layer 1 and the second semiconductor layer 2 with increasing applied reverse voltages above $U_{off}$.

Figure 15:
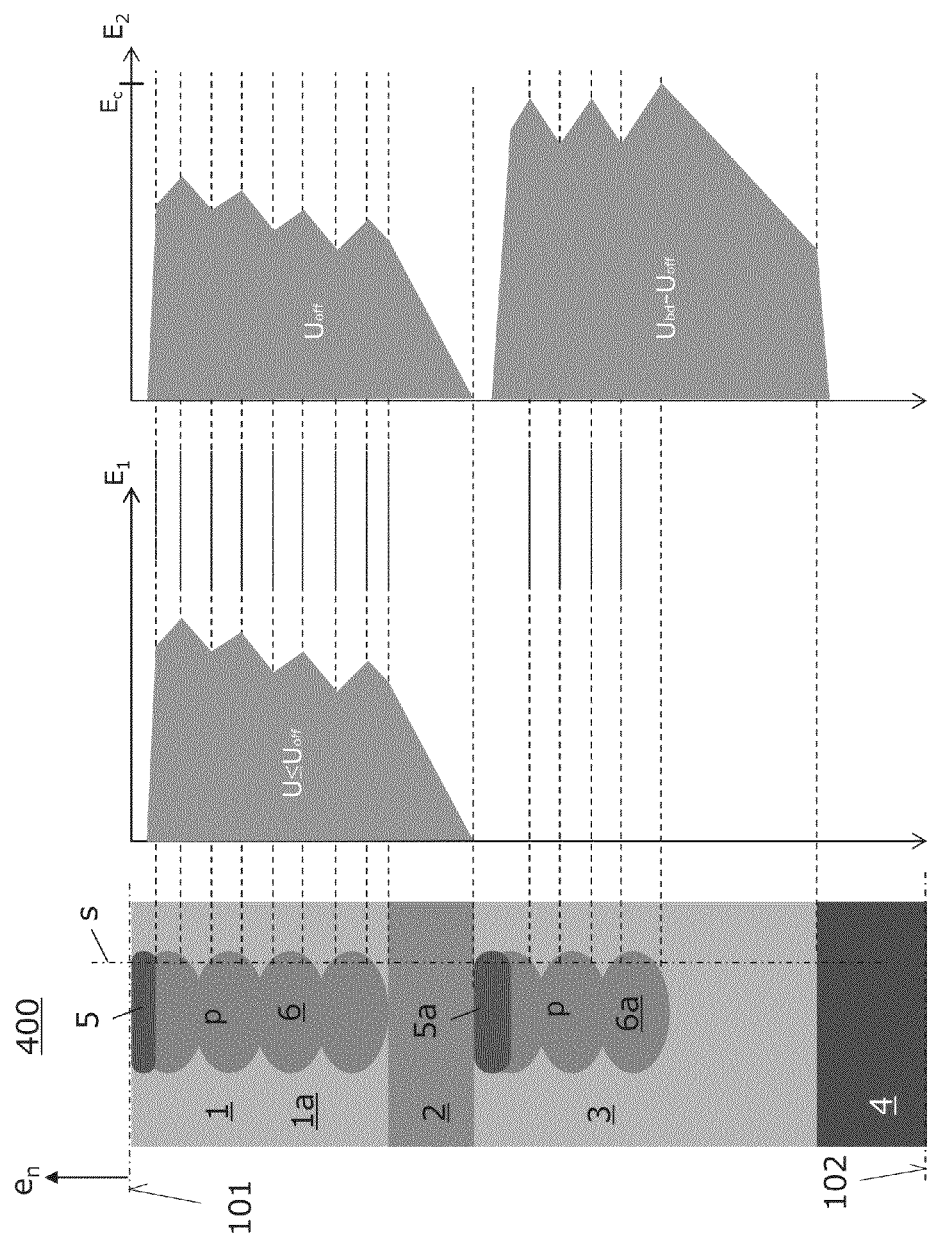
FIG. 15 illustrates vertical electric field distributions of the semiconductor device illustrated in FIG. 7 according to further embodiments.

Different thereto, the electric field strength $E_2$ is substantially unchanged in the first semiconductor layer 1 and the second semiconductor layer 2 for reverse voltages between $U_{off}$ and $U_{bd}$ when the doping charge per horizontal area of the uppermost portions 5a is higher than the breakdown charge per area $q_c$. This is illustrated in FIG. 15. In this embodiment, more counter charges are provided by the uppermost portions 5a and the critical field strength $E_c$ is reached in the semiconductor body below the second semiconductor layer 2 when the breakdown voltage $U_{bd}$ is applied between drain and source.

Figure 16:
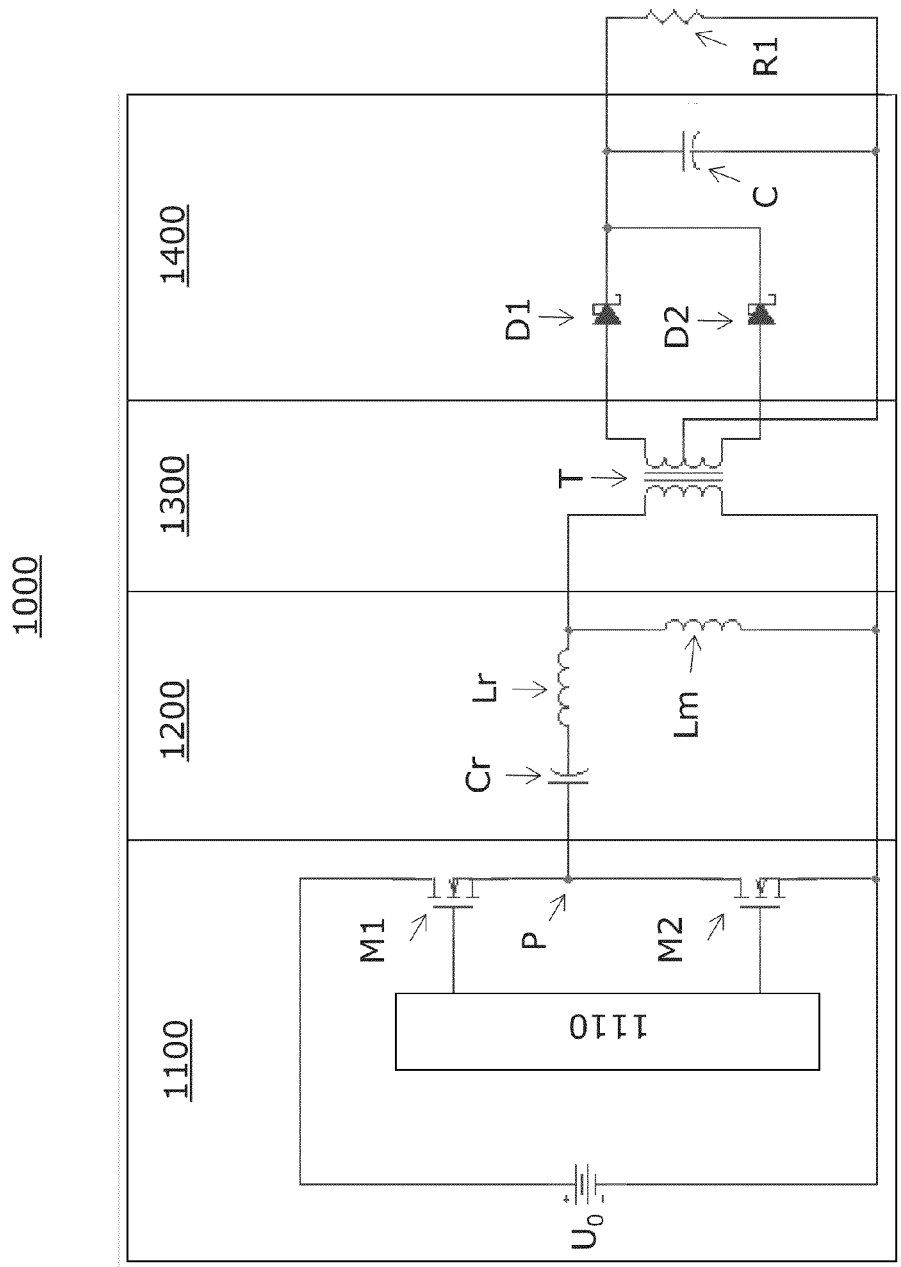
FIG. 16 illustrates a circuit according to an embodiment.

FIG. 16 illustrates a circuit diagram of a circuit 1000 for driving a load R1 which is typically an inductive load such as an electric motor, but may also be a resistive load or a capacitive load. In the exemplary embodiment, the circuit 1000 is a resonant circuit and includes a half-bridge 1100, a resonant tank 1200 connected to and arranged between the half-bridge 1100 and a transformer 1300, T which is connected to a rectification stage 1400 to which the load R1 may be connected.

In the exemplary embodiment, the rectification stage 1400 includes two diodes D1, D2 connected to the transformer T and a capacitor C.

In the exemplary embodiment, the resonant tank 1200 is formed as an LLC-circuit having a capacitor Cr and two inductors Lr and Lm.

In the exemplary embodiment, the half-bridge 1100 includes a power supply U0 connected to two three-terminal semiconductor switches M1, M2 formed as MOSFETs and controlled by a half-bridge controller 1100.

The term "controller" as used in this specification shall embrace a control circuit including a logic circuit and a driver circuit connected to the logic circuit.

During operation, a first load terminal of the switch M1 is typically fed with a positive voltage, for example from a positive terminal of the dc-power supply. Accordingly, switch M1 forms a high-side switch of the half-bridge 1100. The positive voltage may be larger than about 10 V, larger than about 500 V or even larger than about 1000 V compared to ground and the negative terminal of the dc-power supply U0. In the exemplary embodiment, the switch M1 is formed as an n-channel power MOSFET having a drain terminal which is connected to the positive voltage.

Likewise, a second load terminal of the switch M2 is connected with a source providing a voltage that is lower than the positive voltage, for example connected to ground or a negative voltage, and a first load terminal of the switch M2 is connected with a second load terminal of the high-side switch M1. In the exemplary embodiment, the low-side switch M2 is also formed as an n-channel power MOSFET having a source terminal forming its second load terminal. The drain terminal of the low-side switch M2 is connected with the source terminal of the high-side switch M1 and the capacitor Cr of the resonant tank 1300. The half-bridge controller 1100 synchronizes the switch M1 and M2 via their gate terminals. This is to avoid, for example, that the low-side switch M2 is switched on prior to switching off the high-side switch M1 and vice versa.

According to an embodiment, the low-side switch M2 and/or the high-side switch M1 are MOSFETs as explained above with regard to the FIGS. 1 to 8 and 13, for example power MOSFETs, in particular MOSFETs having a compensation structure in a first semiconductor layer and in electric contact with the source metallization and a spaced apart compensation structure formed by floating semiconductor regions 6a. 5a in a third semiconductor layer as explained above with regard to FIGS. 7, 8 and 13. Typically, two MOSFETs of the same type are used as switches M1, M2.

Typically, the MOSFETs are designed such that the floating semiconductor regions 6a, 5a and the third semiconductor layer, respectively, are only depleted during reverse biasing at reverse voltages above the designed circuit voltage, i.e. the nominal reverse off-voltage $U_{off}$ may correspond to the designed circuit voltage.

In such a typical rare event, the floating semiconductor regions 6a. 5a may be charged. However, the controller 1110 typically switches the body diode of the respective MOSFET M1, M2 in a following regular switching-cycle into forward bias. This result in flooding of the respective semiconductor body with electrons and holes. Accordingly, the floating semiconductor regions 6a. 5a are discharged again. Thus Ron of the respective MOSFET M1, M2 remains substantially unchanged and the trade-off between forward current losses and switching losses is improved compared to a similar circuit using conventional compensation MOSFETs.

Note that the circuit 1000 is only an example of a so called soft-switching or zero-voltage-switching application in which the body diodes of the MOSFETs is regularly forwardly biased.

In the exemplary embodiment, the oscillating state of the resonant tank 1200 is controlled by the controller 1110 and the stored energy of the resonant tank 1200 is used to enable zero-voltage-switching of the switches (MOSFET) M1, M2 of the half-bridge 1100.

In the normal oscillating state for driving the load R1, the switches (MOSFETs) M1 and M2 are alternately opened by the controller 1110. In between, both switches M1 and M2 are closed for a short dead time to avoid short-circuiting. Turn off takes place at times of maximum current flow through the inductor Lm, respectively. Beginning with open switch M2 and closed switch M1, the switch-process may be describes as follows. The resonant tank 1200 drives the current through the open switch M2 which is turned off in a first step. After the channel of M2 is closed, the current loads the output capacitance of M2. This results in a rising voltage between the switches M1 and M2 (point P) and in discharging of the output capacitance of M1. When the voltage between the switches M1 and M2 exceeds the designed circuit voltage $V_c$ by the forward voltage $V_f$ of the body diode (about 0.7 V for silicon), the body diode of the switch M1 becomes conductive and pins the voltage at point P to $V_c+V_f$. In this state, the switch M1 can be switched on substantially loss-free (zero-voltage switching). The body diode of M1 is actively flooded by the resonant tank 1200. In so doing, the current flows into the input capacitor until the current direction is reversed. For recharging the output capacitances of M1 and M2 between 0 V an $U_c$, the resonant current must deliver two times the output charge Qoss (at $U_c$). Accordingly, the output charge $Q_{OSS}$ determines the dead time for a complete recharging.

The subsequent switching-off of M1 and switching-on of M2 is similar, except for that the body diode of M2 becomes conductive when the voltage at point P reaches $V_f$.

Accordingly, each switching cycle includes for both switches M1, M2 the switching-off of a current, the increase of the drain voltage to the designed circuit voltage $V_c$, the passive voltage change including a polarity reversal to $V_f$ (body diode becomes conductive), and the switching-on of the channel of the switch (zero-voltage switching).

This is controlled by the controller 1110 which is, thus, adapted to control the high-side switch M1 and the low-side switch M2 such that the respective body-diode is regularly forwardly biased and conductive during driving the load R1.

In the exemplary embodiment, the resonant circuit 1000 includes two semiconductor switch M1, M2 each of which includes: a semiconductor body 40 having first surface 101 and including a first semiconductor layer 1 of a first conductivity type, a second semiconductor layer 2 of the first conductivity type adjoining the first semiconductor layer 1, a third semiconductor layer 3 of the first conductivity type adjoining the second semiconductor layer 2, and a body diode formed by a body region 5 of a second conductivity type and the adjoining the first semiconductor layer 1; a source metallization 10 arranged on the first surface 101 and in low ohmic contact with the body region 5; and a drain metallization 11 in low ohmic contact with the third semiconductor layer. The first semiconductor layer 1 includes a compensation-structure 1, 6, 17, 13b in ohmic contact with the source metallization 10. The third semiconductor layer 3 includes a floating compensation-structure 9, 5a, 6a.

Typically, the floating compensation structure 9, 5a, 6a is only depleted when a reverse voltage is applied between the drain metallization 11 and the source metallization 10 exceeds a designed circuit voltage of the resonant circuit 1000.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit for driving a load, comprising:
    a designed circuit voltage; and
    at least one semiconductor switch having a rated breakdown voltage higher than the designed circuit voltage, the at least one semiconductor switch comprising:
        a semiconductor body having a first surface and comprising a first semiconductor layer of a first conductivity type, a second semiconductor layer of the first conductivity type adjoining the first semiconductor layer, a third semiconductor layer of the first conductivity type adjoining the second semiconductor layer, and a body region of a second conductivity type forming a pn-junction with the first semiconductor layer;
        a source metallization arranged on the first surface and in ohmic contact with the body region; and
        a drain metallization in ohmic contact with the third semiconductor layer,
    wherein the first semiconductor layer comprises a compensation-structure in ohmic contact with the source metallization and the third semiconductor layer comprises a floating compensation-structure.

2. The circuit of claim 1, wherein the floating compensation-structure is only depleted when a reverse voltage applied between the drain metallization and the source metallization exceeds the designed circuit voltage.

3. The circuit of claim 1, wherein the first semiconductor layer comprises, in a vertical cross-section substantially orthogonal to the first surface, at least two compensation regions of a second conductivity type, each of the at least two compensation regions being in ohmic contact with the source metallization and forming a pn-junction with a first portion of the first semiconductor layer, the first portion of the first semiconductor layer being arranged between the at least two compensation regions and forming a pn-compensation-structure with the at least two compensation regions.

4. The circuit of claim 1, wherein the second semiconductor layer is comprised of a semiconductor material having a doping charge per horizontal area lower than a breakdown charge per area of the semiconductor material.

5. The circuit of claim 1, wherein the circuit comprises a half-bridge, and wherein at least one of a high-side switch and a low-side switch of the half-bridge is formed by the at least one semiconductor switch.

6. The circuit of claim 5, wherein the half-bridge comprises a controller which is adapted to control at least one of the high-side switch and the low-side switch such that the respective pn-junction is forwardly biased at least several times during driving the load.

7. The circuit of claim 1, wherein the circuit comprises a resonant tank formed as an LLC circuit comprising a capacitor and two inductors, and wherein one of the source metallization and the drain metallization is connected to the capacitor.

8. The circuit of claim 1, wherein the at least one semiconductor switch is a power MOSFET.

9. The circuit of claim 1, wherein the semiconductor body further comprises a fourth semiconductor layer of the first conductivity type adjoining the third semiconductor layer and having a maximum doping concentration which is higher than a maximum doping concentration of the third semiconductor layer.

* * * * *